United States Patent
Clark et al.

(10) Patent No.: US 9,853,019 B2
(45) Date of Patent: Dec. 26, 2017

(54) INTEGRATED CIRCUIT DEVICE BODY BIAS CIRCUITS AND METHODS

(71) Applicant: Mie Fujitsu Semiconductor Limited, Kuwana, MIE (JP)

(72) Inventors: Lawrence T. Clark, Phoenix, AZ (US); David A. Kidd, San Jose, CA (US); Augustine Kuo, Berkeley, CA (US)

(73) Assignee: Mie Fujitsu Semiconductor Limited, Kuwana (JP)

( * ) Notice: Subject to any disclaimer, the term of this patent is extended or adjusted under 35 U.S.C. 154(b) by 0 days.

(21) Appl. No.: 15/337,876

(22) Filed: Oct. 28, 2016

(65) Prior Publication Data

US 2017/0047100 A1   Feb. 16, 2017

Related U.S. Application Data

(63) Continuation of application No. 14/799,715, filed on Jul. 15, 2015, now Pat. No. 9,548,086, which is a
(Continued)

(51) Int. Cl.
*H03K 17/06* (2006.01)
*H01L 27/02* (2006.01)
(Continued)

(52) U.S. Cl.
CPC .......... *H01L 27/0222* (2013.01); *G05F 3/205* (2013.01); *G06F 17/5045* (2013.01);
(Continued)

(58) Field of Classification Search
CPC ............ G11C 5/146; H02M 2003/078; H02M 2003/076; H03K 2217/0018
See application file for complete search history.

(56) References Cited

U.S. PATENT DOCUMENTS 3,958,266 A   5/1976 Athanas
4,000,504 A   12/1976 Berger
(Continued)

FOREIGN PATENT DOCUMENTS

EP   0274278     7/1988
JP   59193066    1/1984
(Continued)

OTHER PUBLICATIONS

Tschanz et al., "Adaptive Body Bias for Reducing Impacts of Die-to-Die and Within-Die Parameter Variations on Microprocessor Frequency and Leakage," IEEE Journal of Solid-State Circuits, vol. 37, No. 11, Nov. 2002.
(Continued)

*Primary Examiner* — Thomas J Hiltunen
(74) *Attorney, Agent, or Firm* — Baker Botts L.L.P.

(57) ABSTRACT

A system having an integrated circuit (IC) device can include a die formed on a semiconductor substrate and having a plurality of first wells formed therein, the first wells being doped to at least a first conductivity type; a global network configured to supply a first global body bias voltage to the first wells; and a first bias circuit corresponding to each first well and configured to generate a first local body bias for its well having a smaller setting voltage than the first global body bias voltage; wherein at least one of the first wells is coupled to a transistor having a strong body coefficient formed therein, which transistor may be a transistor having a highly doped region formed below a substantially undoped channel, the highly doped region having a dopant concentration greater than that the corresponding well.

3 Claims, 14 Drawing Sheets

Related U.S. Application Data continuation of application No. 13/838,221, filed on Mar. 15, 2013, now Pat. No. 9,112,495.

(51) Int. Cl.

| | |
|---|---|
| *G11C 5/14* | (2006.01) |
| *H03K 3/012* | (2006.01) |
| *G06F 17/50* | (2006.01) |
| *G05F 3/20* | (2006.01) |
| *H01L 27/092* | (2006.01) |
| *G11C 5/02* | (2006.01) |
| *H02M 3/07* | (2006.01) |

(52) U.S. Cl.
CPC .............. *G11C 5/025* (2013.01); *G11C 5/146* (2013.01); *G11C 5/147* (2013.01); *G11C 5/148* (2013.01); *H01L 27/0928* (2013.01); *H03K 3/012* (2013.01); *H03K 17/063* (2013.01); *H02M 2003/076* (2013.01); *H02M 2003/078* (2013.01); *H03K 2217/0018* (2013.01)

(56) References Cited

U.S. PATENT DOCUMENTS

| | | | |
|---|---|---|---|
| 4,021,835 A | 5/1977 | Etoh et al. | |
| 4,208,728 A | 6/1980 | Blahut et al. | |
| 4,242,691 A | 12/1980 | Kotani | |
| 4,276,095 A | 6/1981 | Beilstein, Jr. et al. | |
| 4,315,781 A | 2/1982 | Henderson | |
| 4,578,128 A | 3/1986 | Mundt et al. | |
| 4,617,066 A | 10/1986 | Vasudev | |
| 4,761,384 A | 8/1988 | Neppl et al. | |
| 4,819,043 A | 4/1989 | Yazawa et al. | |
| 5,034,337 A | 7/1991 | Mosher et al. | |
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |
| 5,208,473 A | 5/1993 | Komori et al. | |
| 5,298,763 A | 3/1994 | Shen et al. | |
| 5,369,288 A | 11/1994 | Usuki | |
| 5,384,476 A | 1/1995 | Nishizawa et al. | |
| 5,461,338 A | 10/1995 | Hirayama et al. | |
| 5,557,231 A * | 9/1996 | Yamaguchi | G11C 5/146 |
| | | | 257/E27.081 |
| 5,559,368 A | 9/1996 | Hu et al. | |
| 5,608,253 A | 3/1997 | Liu et al. | |
| 5,663,583 A | 9/1997 | Matloubian et al. | |
| 5,712,501 A | 1/1998 | Davies et al. | |
| 5,719,422 A | 2/1998 | Burr et al. | |
| 5,726,488 A | 3/1998 | Watanabe | |
| 5,763,921 A | 6/1998 | Okumura et al. | |
| 5,780,899 A | 7/1998 | Hu et al. | |
| 5,847,419 A | 12/1998 | Imai et al. | |
| 5,856,003 A | 1/1999 | Chiu | |
| 5,861,334 A | 1/1999 | Rho | |
| 5,877,049 A | 3/1999 | Liu | |
| 5,889,315 A | 3/1999 | Farrenkopf et al. | |
| 5,895,954 A | 4/1999 | Yasumura et al. | |
| 5,923,987 A | 7/1999 | Burr | |
| 5,926,703 A | 7/1999 | Yamaguchi et al. | |
| 5,989,963 A | 11/1999 | Luning et al. | |
| 6,020,227 A | 2/2000 | Bulucea | |
| 6,046,627 A * | 4/2000 | Itoh | G11C 5/146 |
| | | | 257/E27.062 |
| 6,087,210 A | 7/2000 | Sohn | |
| 6,087,691 A | 7/2000 | Hamamoto | |
| 6,096,611 A | 8/2000 | Wu | |
| 6,103,562 A | 8/2000 | Son et al. | |
| 6,121,153 A | 9/2000 | Kikkawa | |
| 6,140,839 A | 10/2000 | Kaviani et al. | |
| 6,147,383 A | 11/2000 | Kuroda | |
| 6,157,073 A | 12/2000 | Lehongres | |
| 6,175,582 B1 | 1/2001 | Naito et al. | |
| 6,184,112 B1 | 2/2001 | Maszara et al. | |
| 6,190,979 B1 | 2/2001 | Radens et al. | |
| 6,194,259 B1 | 2/2001 | Nayak et al. | |
| 6,218,895 B1 | 4/2001 | De et al. | |
| 6,229,188 B1 | 5/2001 | Aoki et al. | |
| 6,245,618 B1 | 6/2001 | An et al. | |
| 6,288,429 B1 | 9/2001 | Iwata et al. | |
| 6,300,177 B1 | 10/2001 | Sundaresan et al. | |
| 6,301,184 B1 * | 10/2001 | Sasaki | G11C 7/1045 |
| | | | 365/226 |
| 6,313,489 B1 | 11/2001 | Letavic et al. | |
| 6,320,222 B1 | 11/2001 | Forbes et al. | |
| 6,326,666 B1 | 12/2001 | Bernstein et al. | |
| 6,358,806 B1 | 3/2002 | Puchner | |
| 6,380,019 B1 | 4/2002 | Yu | |
| 6,391,752 B1 | 5/2002 | Colinge et al. | |
| 6,426,279 B1 | 7/2002 | Huster et al. | |
| 6,444,550 B1 | 9/2002 | Hao et al. | |
| 6,444,551 B1 | 9/2002 | Ku | |
| 6,461,920 B1 | 10/2002 | Shirahata | |
| 6,461,928 B2 | 10/2002 | Rodder | |
| 6,472,278 B1 | 10/2002 | Marshall et al. | |
| 6,482,714 B1 | 11/2002 | Hieda et al. | |
| 6,484,252 B1 | 11/2002 | Watanabe | |
| 6,489,224 B1 | 12/2002 | Burr | |
| 6,492,232 B1 | 12/2002 | Tang et al. | |
| 6,500,739 B1 | 12/2002 | Wang et al. | |
| 6,503,801 B1 | 1/2003 | Rouse et al. | |
| 6,506,640 B1 | 1/2003 | Ishida et al. | |
| 6,518,623 B1 | 2/2003 | Oda et al. | |
| 6,534,373 B1 | 3/2003 | Yu | |
| 6,541,829 B2 | 4/2003 | Nishinohara et al. | |
| 6,548,842 B1 | 4/2003 | Bulucea et al. | |
| 6,551,885 B1 | 4/2003 | Yu | |
| 6,573,129 B2 | 6/2003 | Hoke et al. | |
| 6,600,200 B1 | 7/2003 | Lustig et al. | |
| 6,620,671 B1 | 9/2003 | Wang et al. | |
| 6,624,488 B1 | 9/2003 | Kim | |
| 6,630,710 B1 | 10/2003 | Augusto | |
| 6,630,857 B2 * | 10/2003 | Mizuno | H03K 19/0016 |
| | | | 327/391 |
| 6,660,605 B1 | 12/2003 | Liu | |
| 6,667,200 B2 | 12/2003 | Sohn et al. | |
| 6,670,260 B1 | 12/2003 | Yu et al. | |
| 6,693,333 B1 | 2/2004 | Yu | |
| 6,730,568 B2 | 5/2004 | Sohn | |
| 6,737,724 B2 | 5/2004 | Hieda et al. | |
| 6,743,291 B2 | 6/2004 | Ang et al. | |
| 6,753,230 B2 | 6/2004 | Sohn et al. | |
| 6,770,944 B2 | 8/2004 | Nishinohara et al. | |
| 6,787,424 B1 | 9/2004 | Yu | |
| 6,788,130 B2 * | 9/2004 | Pauletti | H02M 3/073 |
| | | | 327/536 |
| 6,797,994 B1 | 9/2004 | Hoke et al. | |
| 6,808,994 B1 | 10/2004 | Wang | |
| 6,821,825 B2 | 11/2004 | Todd et al. | |
| 6,822,297 B2 | 11/2004 | Nandakumar et al. | |
| 6,831,292 B2 | 12/2004 | Currie et al. | |
| 6,881,641 B2 | 4/2005 | Wieczorek et al. | |
| 6,881,987 B2 | 4/2005 | Sohn | |
| 6,893,947 B2 | 5/2005 | Martinez et al. | |
| 6,916,698 B2 | 7/2005 | Mocuta et al. | |
| 6,930,007 B2 | 8/2005 | Bu et al. | |
| 6,930,360 B2 | 8/2005 | Yamauchi et al. | |
| 6,963,090 B2 | 11/2005 | Passlack et al. | |
| 7,002,214 B1 | 2/2006 | Boyd et al. | |
| 7,008,836 B2 | 3/2006 | Algotsson et al. | |
| 7,013,359 B2 | 3/2006 | Li | |
| 7,015,546 B2 | 3/2006 | Herr et al. | |
| 7,057,216 B2 | 6/2006 | Ouyang et al. | |
| 7,061,058 B2 | 6/2006 | Chakravarthi et al. | |
| 7,064,039 B2 | 6/2006 | Liu | |
| 7,064,399 B2 | 6/2006 | Babcock et al. | |
| 7,071,103 B2 | 7/2006 | Chan et al. | |
| 7,078,325 B2 | 7/2006 | Curello et al. | |
| 7,078,776 B2 | 7/2006 | Nishinohara et al. | |
| 7,089,515 B2 | 8/2006 | Hanafi et al. | |
| 7,106,128 B2 | 9/2006 | Tschanz et al. | |
| 7,119,381 B2 | 10/2006 | Passlack et al. | |

(56) References Cited

U.S. PATENT DOCUMENTS

| | | | |
|---|---|---|---|
| 7,138,851 B2 | 11/2006 | Sumita | |
| 7,164,307 B2 | 1/2007 | Tschanz et al. | |
| 7,170,120 B2 | 1/2007 | Datta et al. | |
| 7,176,745 B2 | 2/2007 | Itoh et al. | |
| 7,186,598 B2 | 3/2007 | Yamauchi et al. | |
| 7,189,627 B2 | 3/2007 | Wu et al. | |
| 7,199,430 B2 | 4/2007 | Babcock et al. | |
| 7,202,517 B2 | 4/2007 | Dixit et al. | |
| 7,211,871 B2 | 5/2007 | Cho | |
| 7,221,021 B2 | 5/2007 | Wu et al. | |
| 7,223,646 B2 | 5/2007 | Miyashita et al. | |
| 7,226,833 B2 | 6/2007 | White et al. | |
| 7,226,843 B2 | 6/2007 | Weber et al. | |
| 7,235,822 B2 | 6/2007 | Li | |
| 7,236,045 B2 | 6/2007 | Tschanz et al. | |
| 7,247,896 B2 | 7/2007 | Oh et al. | |
| 7,294,877 B2 | 11/2007 | Rueckes et al. | |
| 7,297,994 B2 | 11/2007 | Wieczorek et al. | |
| 7,301,208 B2 | 11/2007 | Handa et al. | |
| 7,304,350 B2 | 12/2007 | Misaki | |
| 7,312,500 B2 | 12/2007 | Miyashita et al. | |
| 7,323,754 B2 | 1/2008 | Ema et al. | |
| 7,330,049 B2 * | 2/2008 | Perisetty | H01L 27/0921 257/E27.063 |
| 7,332,439 B2 | 2/2008 | Lindert et al. | |
| 7,348,629 B2 | 3/2008 | Chu et al. | |
| 7,354,833 B2 | 4/2008 | Liaw | |
| 7,355,437 B2 * | 4/2008 | Perisetty | H03K 19/00315 326/14 |
| 7,427,788 B2 | 9/2008 | Li et al. | |
| 7,442,971 B2 | 10/2008 | Wirbeleit et al. | |
| 7,443,641 B2 | 10/2008 | Suzuki | |
| 7,462,908 B2 | 12/2008 | Bol et al. | |
| 7,485,536 B2 | 2/2009 | Jin et al. | |
| 7,491,988 B2 | 2/2009 | Tolchinsky et al. | |
| 7,494,861 B2 | 2/2009 | Chu et al. | |
| 7,498,637 B2 | 3/2009 | Yamaoka et al. | |
| 7,501,324 B2 | 3/2009 | Babcock | |
| 7,501,849 B2 * | 3/2009 | Perisetty | H03K 19/00315 326/15 |
| 7,507,999 B2 | 3/2009 | Kusumoto et al. | |
| 7,510,932 B2 | 3/2009 | Oh et al. | |
| 7,514,953 B2 | 4/2009 | Perisetty | |
| 7,521,323 B2 | 4/2009 | Surdeanu | |
| 7,531,393 B2 | 5/2009 | Doyle | |
| 7,538,412 B2 | 5/2009 | Schulze | |
| 7,555,667 B1 | 6/2009 | Burney | |
| 7,564,105 B2 | 7/2009 | Chi | |
| 7,592,241 B2 | 9/2009 | Takao | |
| 7,592,832 B2 * | 9/2009 | Perisetty | H03K 19/0013 326/37 |
| 7,598,142 B2 | 10/2009 | Ranade | |
| 7,605,041 B2 | 10/2009 | Ema | |
| 7,605,060 B2 | 10/2009 | Meunier-Beillard et al. | |
| 7,605,429 B2 | 10/2009 | Bernstein et al. | |
| 7,608,496 B2 | 10/2009 | Chu | |
| 7,615,802 B2 | 11/2009 | Elpelt et al. | |
| 7,622,341 B2 | 11/2009 | Chudzik et al. | |
| 7,639,041 B1 * | 12/2009 | Perisetty | H03K 19/0016 326/38 |
| 7,642,140 B2 | 1/2010 | Bae et al. | |
| 7,645,665 B2 | 1/2010 | Kubo et al. | |
| 7,651,920 B2 | 1/2010 | Siprak | |
| 7,655,523 B2 | 2/2010 | Babcock et al. | |
| 7,667,527 B2 | 2/2010 | Clark et al. | |
| 7,675,126 B2 | 3/2010 | Cho | |
| 7,675,317 B2 | 3/2010 | Perisetty | |
| 7,678,638 B2 | 3/2010 | Chu et al. | |
| 7,681,628 B2 | 3/2010 | Joshi et al. | |
| 7,682,887 B2 | 3/2010 | Dokumaci et al. | |
| 7,683,442 B1 | 3/2010 | Burr et al. | |
| 7,696,000 B2 | 4/2010 | Liu et al. | |
| 7,704,844 B2 | 4/2010 | Zhu et al. | |
| 7,709,828 B2 | 5/2010 | Braithwaite et al. | |
| 7,723,750 B2 | 5/2010 | Zhu | |
| 7,750,405 B2 | 7/2010 | Nowak | |
| 7,750,670 B2 | 7/2010 | Goodnow et al. | |
| 7,750,682 B2 | 7/2010 | Bernstein et al. | |
| 7,755,146 B2 | 7/2010 | Helm et al. | |
| 7,759,714 B2 | 7/2010 | Itoh et al. | |
| 7,795,677 B2 | 9/2010 | Bangsaruntip et al. | |
| 7,800,404 B2 | 9/2010 | Verma et al. | |
| 7,812,662 B2 * | 10/2010 | Lundberg | G05F 3/205 327/534 |
| 7,818,702 B2 | 10/2010 | Mandelman et al. | |
| 7,829,402 B2 | 11/2010 | Matocha et al. | |
| 7,867,835 B2 | 1/2011 | Lee et al. | |
| 7,883,977 B2 | 2/2011 | Babcock et al. | |
| 7,888,747 B2 | 2/2011 | Hokazono et al. | |
| 7,897,495 B2 | 3/2011 | Ye et al. | |
| 7,906,413 B2 | 3/2011 | Cardone et al. | |
| 7,906,813 B2 | 3/2011 | Kato et al. | |
| 7,919,791 B2 | 4/2011 | Flynn et al. | |
| 7,948,008 B2 | 5/2011 | Liu et al. | |
| 7,952,147 B2 | 5/2011 | Ueno et al. | |
| 7,960,232 B2 | 6/2011 | King et al. | |
| 7,960,238 B2 | 6/2011 | Kohli et al. | |
| 7,968,400 B2 | 6/2011 | Cai | |
| 7,968,411 B2 | 6/2011 | Williford | |
| 7,978,001 B2 * | 7/2011 | Bertram | H03K 19/0013 327/534 |
| 8,004,024 B2 | 8/2011 | Furukawa et al. | |
| 8,012,827 B2 | 9/2011 | Yu et al. | |
| 8,039,332 B2 | 10/2011 | Bernard et al. | |
| 8,048,791 B2 | 11/2011 | Hargrove et al. | |
| 8,048,810 B2 | 11/2011 | Tsai et al. | |
| 8,067,279 B2 | 11/2011 | Sadra et al. | |
| 8,105,891 B2 | 1/2012 | Yeh et al. | |
| 8,106,424 B2 | 1/2012 | Schruefer | |
| 8,106,481 B2 | 1/2012 | Rao | |
| 8,112,551 B2 | 2/2012 | Sullam et al. | |
| 8,119,482 B2 | 2/2012 | Bhalla et al. | |
| 8,120,069 B2 | 2/2012 | Hynecek | |
| 8,129,246 B2 | 3/2012 | Babcock et al. | |
| 8,129,797 B2 | 3/2012 | Chen et al. | |
| 8,134,159 B2 | 3/2012 | Hokazono | |
| 8,143,120 B2 | 3/2012 | Kerr et al. | |
| 8,143,124 B2 | 3/2012 | Challa | |
| 8,143,678 B2 | 3/2012 | Kim | |
| 8,148,774 B2 | 4/2012 | Mori et al. | |
| 8,163,619 B2 | 4/2012 | Yang et al. | |
| 8,173,502 B2 | 5/2012 | Yan et al. | |
| 8,178,430 B2 | 5/2012 | Kim et al. | |
| 8,183,096 B2 | 5/2012 | Wirbeleit | |
| 8,183,107 B2 | 5/2012 | Mathur et al. | |
| 8,217,427 B2 | 7/2012 | Chuang et al. | |
| 8,236,661 B2 | 8/2012 | Dennard et al. | |
| 8,970,289 B1 | 3/2015 | Lee | |
| 9,112,495 B1 * | 8/2015 | Clark | H03K 17/063 |
| 9,251,866 B2 * | 2/2016 | Chun | G11C 5/146 |
| 9,431,068 B2 * | 8/2016 | Clark | G11C 5/146 |
| 2001/0014495 A1 | 8/2001 | Yu | |
| 2003/0122203 A1 | 7/2003 | Nishinohara et al. | |
| 2003/0183856 A1 | 10/2003 | Wieczorek et al. | |
| 2004/0075118 A1 | 4/2004 | Heinemann et al. | |
| 2004/0084731 A1 | 5/2004 | Matsuda et al. | |
| 2004/0263205 A1 | 12/2004 | Park | |
| 2005/0097196 A1 | 5/2005 | Wronski et al. | |
| 2005/0116282 A1 | 6/2005 | Pattanayak | |
| 2005/0250289 A1 | 11/2005 | Babcock et al. | |
| 2006/0022270 A1 | 2/2006 | Boyd et al. | |
| 2006/0049464 A1 | 3/2006 | Rao | |
| 2006/0066388 A1 | 3/2006 | Tschanz et al. | |
| 2006/0068555 A1 | 3/2006 | Zhu et al. | |
| 2006/0068586 A1 | 3/2006 | Pain | |
| 2006/0071278 A1 | 4/2006 | Takao | |
| 2006/0154428 A1 | 7/2006 | Dokumaci | |
| 2007/0004107 A1 | 1/2007 | Lee et al. | |
| 2007/0040222 A1 | 2/2007 | Van Camp et al. | |
| 2007/0158790 A1 | 7/2007 | Rao | |
| 2007/0238253 A1 | 10/2007 | Tucker | |
| 2008/0001171 A1 | 1/2008 | Tezuka et al. | |
| 2008/0067589 A1 | 3/2008 | Ito et al. | |

(56) References Cited

U.S. PATENT DOCUMENTS

| | | | |
|---|---|---|---|
| 2008/0143423 | A1 | 6/2008 | Komatsu et al. |
| 2008/0169493 | A1 | 7/2008 | Lee et al. |
| 2008/0197439 | A1 | 8/2008 | Goerlach et al. |
| 2008/0227250 | A1 | 9/2008 | Ranade et al. |
| 2008/0246533 | A1 | 10/2008 | Barrows et al. |
| 2008/0258198 | A1 | 10/2008 | Bojarczuk et al. |
| 2008/0272409 | A1 | 11/2008 | Sonkusale et al. |
| 2009/0057746 | A1 | 3/2009 | Sugll et al. |
| 2009/0108350 | A1 | 4/2009 | Cai et al. |
| 2009/0134468 | A1 | 5/2009 | Tsuchiya |
| 2009/0179692 | A1 | 7/2009 | Hidaka |
| 2009/0302388 | A1 | 12/2009 | Cai |
| 2009/0311837 | A1 | 12/2009 | Kapoor |
| 2009/0321849 | A1 | 12/2009 | Miyamura et al. |
| 2010/0012988 | A1 | 1/2010 | Yang et al. |
| 2010/0038724 | A1 | 2/2010 | Anderson et al. |
| 2010/0055886 | A1 | 3/2010 | Izumida et al. |
| 2010/0073073 | A1 | 3/2010 | Bertram |
| 2010/0187641 | A1 | 7/2010 | Zhu et al. |
| 2011/0073961 | A1 | 3/2011 | Dennard et al. |
| 2011/0074498 | A1 | 3/2011 | Thompson |
| 2011/0079860 | A1 | 4/2011 | Verhulst et al. |
| 2011/0079861 | A1 | 4/2011 | Shifren et al. |
| 2011/0169082 | A1 | 7/2011 | Zhu et al. |
| 2011/0175170 | A1 | 7/2011 | Wang et al. |
| 2011/0180880 | A1 | 7/2011 | Chudzik et al. |
| 2011/0193164 | A1 | 8/2011 | Zhu |
| 2012/0021594 | A1 | 1/2012 | Gurtej et al. |
| 2012/0056275 | A1 | 3/2012 | Cai et al. |
| 2012/0108050 | A1 | 5/2012 | Chen et al. |
| 2012/0190177 | A1 | 7/2012 | Kim et al. |
| 2014/0119099 | A1 | 5/2014 | Clark |
| 2014/0307513 | A1* | 10/2014 | Chun ............... G11C 5/146 365/189.09 |
| 2015/0318026 | A1 | 11/2015 | Clark |

FOREIGN PATENT DOCUMENTS

| | | |
|---|---|---|
| JP | 4186774 | 3/1992 |
| JP | 8288508 | 1/1996 |
| JP | 8153873 | 6/1996 |
| JP | 2004087671 | 3/2004 |
| KR | 1020040024599 | 10/2005 |
| WO | 2011062788 | 5/2011 |

OTHER PUBLICATIONS

Werner, P. et al., "Carbon Diffusion in Silicon," Applied Physics Letters, vol. 73, No. 17, pp. 2465-2467, Oct. 1998.
Yan, Ran-Hong et al., "Scaling the Si MOSFET: From Bulk to SOI to Bulk," IEEE Transactions on Electron Devices, vol. 39, No. 7, Jul. 1992.
Abiko, H. et al., "A Channel Engineering Combined with Channel Epitaxy Optimization and RED Suppression for 0.15μm n-n Gate CMOS Technology." 1995 Symposium on VLSI Technology Digest of Technical Papers, pp. 23-24, 1995.
Chau, R. et al., "A 50nm Depleted-Substrate CMOS Transistor (DST)", Electron Device Meeting 2001, IEDM Technical Digest, IEEE International, pp. 29.1.1-29.1.4, 2001.
Ducroquet, F. et al. "Fully Depleted Silicon-On Insulator nMOSFETs with Tensile Strained High Carbon Content Si1-yCy Channel", ECS 210th Meeting, Abstract 1033, 2006.
English Translation of JP 815383, 1996.
Ernst, T. et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.
Goesele, U. et al., "Diffusion Engineering by Carbon in Silicon", Mat. Res. Soc. Symp. vol. 610, pp. 1-12, 2000.
Hokazono, A. et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.
Hokazono, A. et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.
Holland, OW and Thomas, DK "A Method to Improve Activation of Implanted Dopants in SiC", Oak Ridge National Laboratory, Oak Ridge, TN, pp. 1-9, 2001.
Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462, 1996.
Lavéant, P. "Incorporation, Diffusion and Agglomeration of Carbon in Silicon", Solid State Phenomena, vols. 82-84, pp. 189-194, 2002.
Noda, K. et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.
Ohguro, T. et al., "An 0.18-μm CMOS for Mixed Digital and Analog Applications with Zero-Volt-Vth Epitaxial-Channel MOSFET's", IEEE Transactions on Electron Devices, vol. 46, No. 7, pp. 1378-1383, Jul. 1999.
Pinacho, R. et al., "Carbon in Silicon: Modeling of Diffusion and Clustering Mechanisms", Journal of Applied Physics, vol. 92, No. 3, pp. 1582-1588, Aug. 2002.
Robertson, LS et al., "The Effect of Impurities on Diffusion and Activation of Ion Implanted Boron in Silicon", Mat. Res. Soc. Symp. vol. 610, 2000.
Scholz, R. et al., "Carbon-Induced Undersaturation of Silicon Self-Interstitials", Appl. Phys. Lett. 72(2), pp. 200-202, Jan. 1998.
Scholz, RF et al., "The Contribution of Vacancies to Carbon Out-Diffusion in Silicon", Appl. Phys. Lett., vol. 74, No. 3, pp. 392-394, Jan. 1999.
Stolk, PA et al., "Physical Mechanisms of Transient Enhanced Dopant Diffusion in Ion-Implanted Silicon", J. Appl. Phys. 81(9), pp. 6031-6050, May 1997.
Thompson, S. et al., "MOS Scaling: Transistor Challenges for the 21st Century", Intel Technology Journal Q3' 1998, pp. 1-19, 1998.
Wann, C., et al., "Channel Profile Optimization and Devices Design for Low-Power High-Performance Dynamic Threshold MOSFET", IEDM 96, pp. 113-116.

* cited by examiner

INTEGRATED CIRCUIT DEVICE BODY BIAS CIRCUITS AND METHODS

RELATED APPLICATIONS

This application is a continuation of U.S. Application Ser. No. is a continuation of U.S. application Ser. No. 14/799,715 filed Jul. 15, 2015 and entitled "Integrated Circuit Device Body Bias Circuits and Methods" which is a continuation of Ser. No. 13/838,221 filed Mar. 15, 2013 and entitled "Integrated Circuit Device Body Bias Circuits and Methods", now U.S. Pat. No. 9,112,495 which issued Aug. 18, 2015, the entirety of which is hereby incorporated by reference.

TECHNICAL FIELD

The present invention relates generally to body biasing circuit solutions for systems including an integrated circuit (IC) device, and more particularly to body biasing circuit techniques that provide different body bias voltages to different blocks of an IC device.

BACKGROUND

Integrated circuit (IC) devices can include n-channel and p-channel transistors. In some IC devices, one or both types of transistors can be formed in wells. To increase the absolute value of the threshold voltage, the wells can be reverse biased ("back" biased). Thus, n-wells containing p-channel transistors can be reverse biased to a positive voltage greater than a high power supply for the transistors. Conversely, p-wells containing n-channel transistors can be reverse biased to a voltage more negative than their low source voltage (i.e., a voltage lower than ground).

Under certain operating conditions, IC devices can be subject to current transient events. Such events can result in a "droop" of a power supply voltage, which can slow the operation of some circuits. Conventionally, such circuits are designed with a timing "guard band", at the cost of performance, to ensure proper operation in the event of a current transient event. Further, in some conventional approaches, in response to current transient events, the IC device can increase a reverse body bias voltage (increase the setting of a reverse body bias).

DETAILED DESCRIPTION

Figure 1:
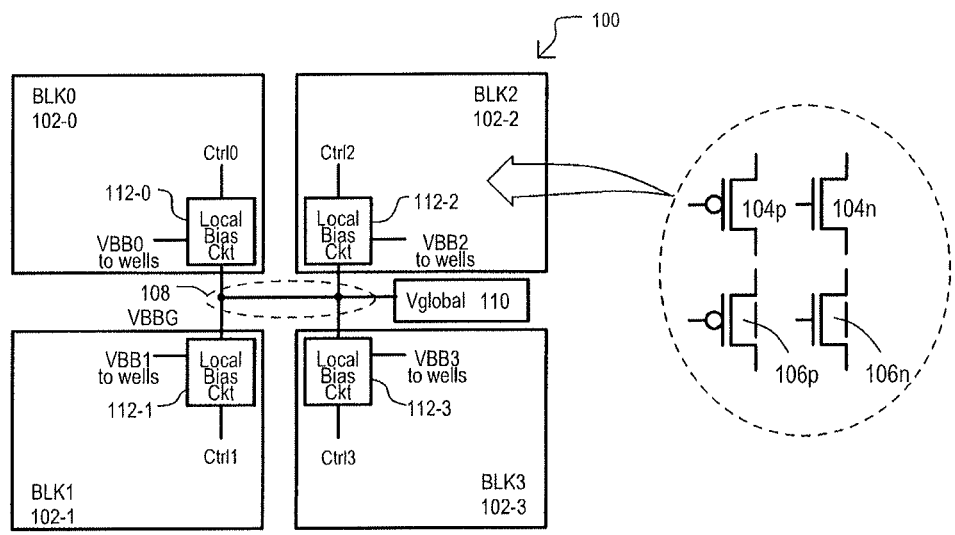
FIG. 1 is a block schematic diagram of an integrated circuit (IC) device according to one embodiment.

Various embodiments of the present invention will now be described in detail with reference to a number of drawings. The embodiments show integrated circuit devices, body bias control and generation circuits and related methods, including power up sequences. Body bias values can be varied between circuit blocks to vary (e.g., optimize) circuit block performance. According to some embodiments, in response to current transient events, body bias voltages for circuit blocks can be "collapsed" to lower body bias voltage levels.

In the various embodiments described below, like items are referred to with the same reference character but with the leading digits corresponding to the figure number.

FIG. 1 is a top plan view of an integrated circuit (IC) device 100 according to an embodiment. An IC device 100 can include a number of blocks (102-0 to -3), each of which can include a number of transistors having body regions which can be reverse biased. Transistors can include any suitable insulated gate field effect transistor having sufficiently strong body coefficients (referred to herein as "MOS" type transistors, but not implying any particular gate or gate dielectric material). Accordingly, transistors can include any of: conventional p-channel (PMOS) transistors (e.g., 104n), conventional n-channel (NMOS) transistors (e.g., 104p), the conventional transistors having strong body coefficients, or deeply depleted channel (DDC) PMOS transistors (e.g., 106p), or DDC NMOS transistors (e.g., 106n) (which by way of a typical architecture of such transistor, has strong body coefficient). An embodiment of a DDC transistor will be described in more detail below. Other transistor types, for instance, transistors with a three-dimensional gate and a heavily doped body region can be used. It is understood that there is inevitably be a certain degree of variation among conventional transistor construction (e.g., variations in threshold voltage, gate insulator thickness, source-drain diffusion profiles, etc.). DDC transistor constructions can have their own variation as well, though the degree of variation for DDC transistors is generally less than conventional counterparts. Though embodiments are provided contemplating a mix of transistor designs, preferably, DDC transistors are used wherever possible in IC device 100. Note that transistors having strong body coefficient and particularly with body biasing, are amenable for use in circuit applications operating in the subthreshold region or near-threshold computing (having a supply voltage sufficiently low as to be near the threshold voltage setting).

Transistors receiving a body bias can also have a predetermined threshold voltage relationship with respect to a received power supply voltage. In some embodiments, transistors can have a threshold voltage setting that is less than or equal to 0.2V less than a supply voltage to the transistor.

Blocks (102-0 to 102-3) can include circuits of different types. According to particular embodiments, the blocks (102-0 to 102-3) can include but are not limited to any of: memory circuits; e.g., dynamic random access memory, (DRAM), static RAM (SRAM) or nonvolatile memory); processor circuits, e.g., one or more central processing units (CPUs), application PUs (APUs), graphic PUs (GPUs); application specific logic circuits; or analog circuits. Such different types of blocks can have transistors with different threshold voltages, and can have different responses to current transient events. In some embodiments, an IC device 100 can be a system-on-chip (SoC) type device, integrating processor circuits, memory circuits and other application specific circuits. In other embodiments, IC device 100 may be a system with one or more blocks segregated on individual die and assembled on one or more system boards.

IC device 100 includes a global body bias supply 110, which can provide one or more global body bias voltages (VBBG) to each block (102-0 to -3) via a global network 108. A global body bias supply 110 can be a voltage generating circuit, or can be an IC device connection (e.g., bond pad, pin, etc.) that receives an external voltage. A global body bias voltage generating circuit can generally include a charge pump circuit, a switched capacitor circuit, or a voltage regulator.

Each block (102-0 to -3) can include its own local bias circuit 112-0 to -3. Each local bias circuit (112-0 to -3) can generate one or more local body bias voltages (VBB0 to VBB3) from global body bias voltage(s) VBBG. Such local body bias voltages can be reverse body bias voltages that are applied to bodies of transistors within its block (102-0 to -3). Accordingly, body bias voltages for each block (102-0 to -3) can be tuned for the performance of the transistors within the block. Local body bias voltages (VBB0 to VBB3) can be static voltages, that generally do not change once the IC device is operational (but can vary between blocks) and/or can be dynamic voltages that change (e.g., change in response to an IC device mode or event).

According to some embodiments, local body bias voltages (VBB0 to VBB3) can have smaller settings than the global body bias voltage (VBBG) from which they are generated. For example, if a global body bias voltage is a positive voltage for p-channel transistors, corresponding local body bias voltages can have a lower positive voltage. Similarly, if a global body bias voltage is a negative voltage for n-channel transistors, corresponding local body bias voltages can have a higher voltage (i.e., can be less negative).

In the particular embodiment shown, each local bias circuit (112-0 to -3) can generate a local body bias voltage (VBB0 to VBB3) that varies in response to a control value (Ctrl0 to Ctrl3). Thus, a local body bias voltage (VBB0 to VBB3) can be set according to such a value. A control value (Ctrl0 to Ctrl3) can be an analog value or can be a digital value. In this way, a body bias voltage to each different section can be adjusted independently.

It is understood that any of the blocks (102-0 to -3) can include transistors without a reverse body bias voltage (i.e., transistors with bodies biased to a power supply level).

Figures 2A, 2B:
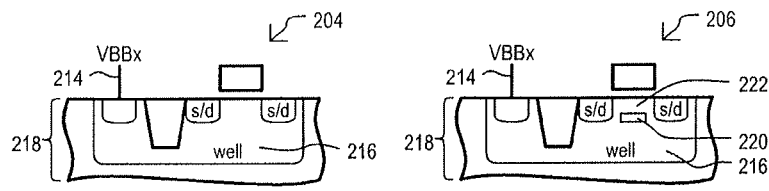
FIGS. 2A to 2C are side cross sectional representations showing body bias connections that can be included in embodiments.
Figure 2C:
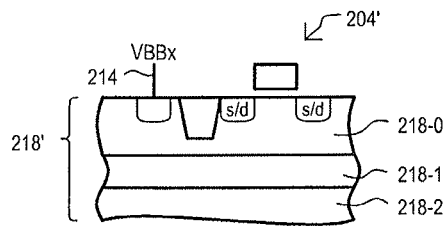

FIGS. 2A to 2C are side cross sectional representations of body bias connections to transistors of a block that can be included in the embodiments described herein. FIG. 2A shows a conventional transistor 204 formed in a well 216. A well 216 can be of opposite conductivity type to a substrate 218 (or larger well) in which it is formed. A body bias voltage for the transistor can be applied via a body bias connection 214 to the well 216.

FIG. 2B is one very particular representation of a DDC transistor 206 formed in a well 216. As in the case of FIG. 2A, well 216 can be of opposite conductivity type to a substrate 218 (or larger well) in which it is formed. A body bias voltage for the transistor can be applied via a body bias connection 214 to the well 216. A DDC transistor 206 can include a highly doped screening region 220 and substantially undoped channel 222. Again, there are various embodiments of DDC transistors, some of which will be described in more detail below.

FIG. 2C shows a semiconductor on insulator (SOI) transistor 204' formed on an SOI substrate 218'. An SOI substrate 218' can include an active layer 218-0, insulating layer 218-1, and base substrate 218-2. Transistor 204' can be formed in active layer 218-0. A body bias voltage for the transistor can be applied via a body bias tap 214 to the active layer 218-0.

The various body bias connections shown in FIGS. 2A to 2C are intended to be exemplary and not limiting. A local body bias voltage as described herein can be applied to bias the body voltage of a transistor using any suitable means for the given transistor.

Figure 3:
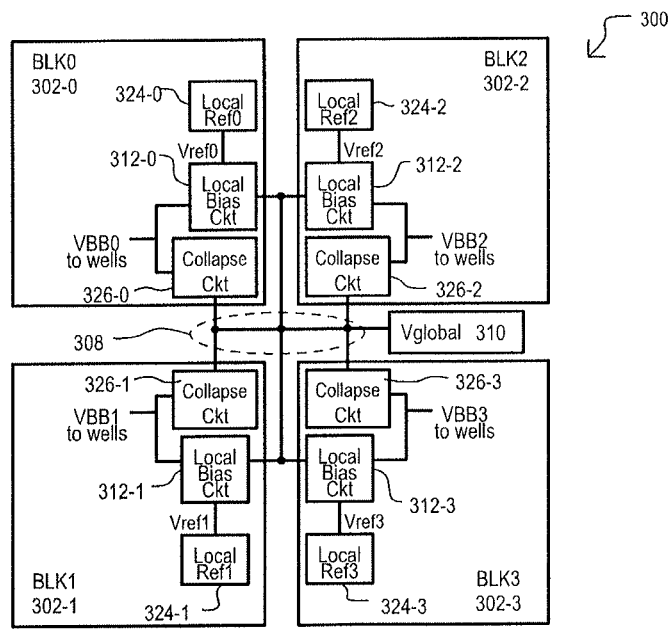
FIG. 3 is a block schematic diagram of an IC device according to another embodiment.

FIG. 3 is a top plan view of an IC device 300 according to another embodiment. An IC device 300 can include a number of blocks (302-0 to -3), global body bias supply 310, and global body bias network 308. Further, each block (302-0 to -3) can include a local body bias circuit (312-0 to -3). Such sections can be the same as, and subject to the same variations as those of FIG. 1. It is noted that in alternate embodiments, features shown as on the IC device 300 may be part of a system, for instance, a board having IC device(s) thereon; by way of example, global body bias supply 310 may be remote from IC device 300 and may feed in to IC device 300 from a system that includes IC device 300 assembled therein.

FIG. 3 further shows a local reference supply 324-0 to -3 and collapse circuit 326-0 to -3 corresponding to each block (302-0 to -3). A local reference supply (324-0 to -3) can provide a reference value (Vref0 to Vref3) to each local bias circuit (312-0 to -3). A local bias circuit (312-0 to -3) can control its body bias voltage (VBB0 to VBB3) by comparing a current body bias voltage to a reference voltage. A reference value (Vref0 to Vref3) can be a voltage, current, or digital value. In some embodiments, a reference value (Vref0 to Vref3) remains constant, and body bias voltage can be adjusted by programming an allowable difference between the reference value and the body bias voltage. Alternatively, a reference value (Vref0 to Vref3) can be adjustable, and a body bias voltage can track the reference value.

Each collapse circuit (326-0 to -3) can selectively connect the bodies of transistors of its section to a "collapse" voltage. A collapse voltage can be a voltage having a setting less than the body bias voltage. In some embodiments, a collapse voltage can be a low power supply voltage level. As but one example, n-channel transistors can have a collapse voltage of zero volts (e.g., a low power supply level VSS), while p-channel transistors can have a collapse voltage of a high supply voltage (e.g., VDD, VCC). According to embodiments, collapse circuits (326-0 to -3) can collapse a body bias voltage to a collapse voltage in response to predetermined events. Such events can include events which can cause a current transient. In this way, a body bias voltage setting for transistors can be reduced in the event of a current transient event. This is in contrast to conventional approaches which either do not modify or can increase a body bias voltage setting in such cases.

In some embodiments, collapse circuits (326-0 to -3) can be programmable, being enabled in response to a selected set of events or modes of operation. In addition or alternatively, collapse circuits (326-0 to -3) can have a programmable delay between an event and the collapse operation.

Figure 4:
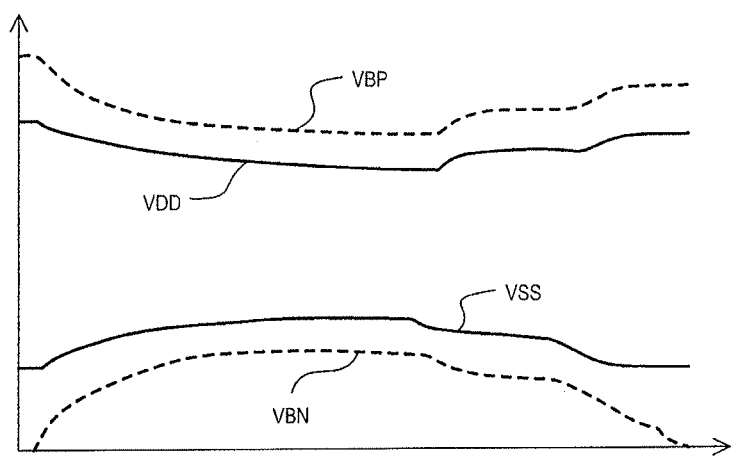
FIG. 4 is a graph showing reductions in body bias voltage during current transient events according to one particular embodiment.

FIG. 4 is a timing diagram showing a collapse operation according to one very particular embodiment. In the embodiment of FIG. 4, collapse circuits can enable reverse body bias voltages to be selected to track a power supply level in the event of a current transient event.

FIG. 4 includes the following waveforms: VDD can be a high power supply voltage; VSS can be a low power supply voltage (e.g., ground); VBN can be a reverse body bias voltage for n-channel transistors; and VBP can be a reverse body bias voltage for p-channel transistors. As shown, in the event of a transient event, power supply levels (VDD/VSS) can "droop", moving towards each other. In response, collapse circuits can cause the body bias voltages (VBN/VBP) to track such power levels.

As noted above, in very particular embodiments, such a tracking can be accomplished by having VBN collapse to VSS and VBP collapse to VDD.

Figure 5:
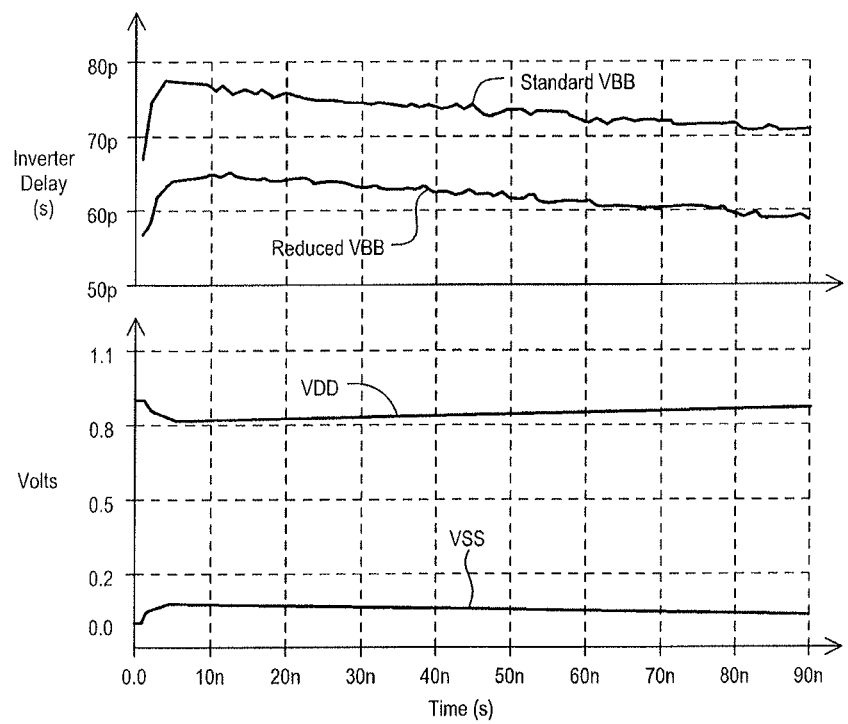
FIG. 5 shows graphs of how reductions in body bias voltage can increase circuit speed during current transient events.

FIG. 5 is a timing diagram showing how reducing the setting of a reverse body bias voltage can increase circuit speed over high body bias levels.

FIG. 5 includes the following waveforms: an inverter delay with a standard reverse body bias (Standard VBB), an inverter delay with a reduced reverse body bias (i.e., a body bias having a lower setting than the Standard VBB) (Reduced VBB); as well as power supply levels (VDD/VSS) simulating a current transient event (i.e., droop).

As shown, reducing the setting of the reverse body bias can result in faster performance than maintaining the reverse body bias level. In this way, reducing a reverse body bias level during current transient events can increase performance, which can result in reduced guard-banding against such events.

Figure 6:
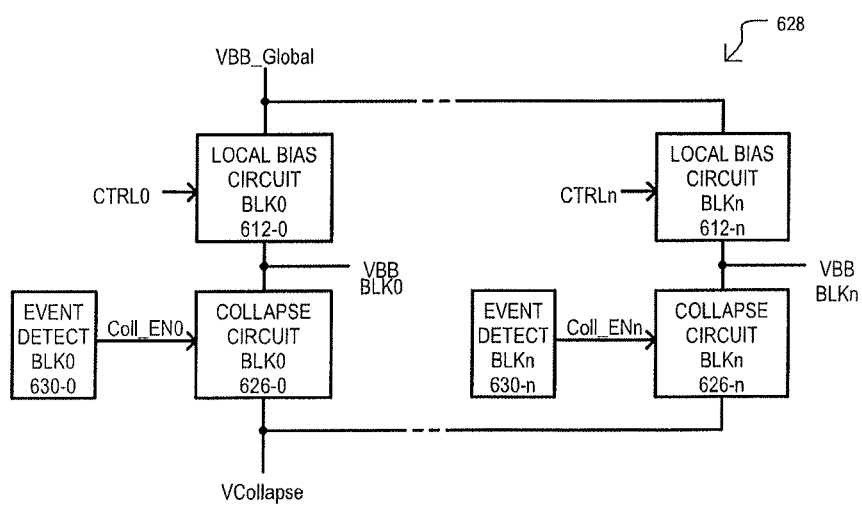
FIG. 6 is a block schematic diagram of a body bias control circuit according to an embodiment.

FIG. 6 is a block schematic diagram of a body bias control circuit 628 according to an embodiment. Body bias control circuit 628 can include local body bias circuits (612-0 to 612-n), collapse circuits (626-0 to 626-n), and event detect circuits (630-0 to -n). Each local body bias control circuit (612-0 to 612-n) can provide a reverse body bias VBB BLK0 to VBB BLKn to a corresponding group of transistors, as described herein, or equivalents.

A collapse circuit (626-0 to 626-n) can collapse body bias voltages to a set of transistors to a collapse voltage (VCollapse) as described herein, or equivalents. A collapse voltage (Vcollapse) can be static voltage or can be a dynamic voltage (e.g., a voltage that tracks power supply droop). In the embodiment shown, each collapse circuit (626-0 to 626-n) can collapse its body bias voltage in response to an enable signal (Coll_EN0 to Coll_ENn) generated by a corresponding event detect circuit (630-0 to -n).

Each event detect circuit (630-0 to -n) can activate its collapse enable signal (Coll_EN0 to Coll_ENn) in response to one or more predetermined conditions. Such conditions can include operations on an IC device and/or signals received from sources external to the IC device.

Figure 7:
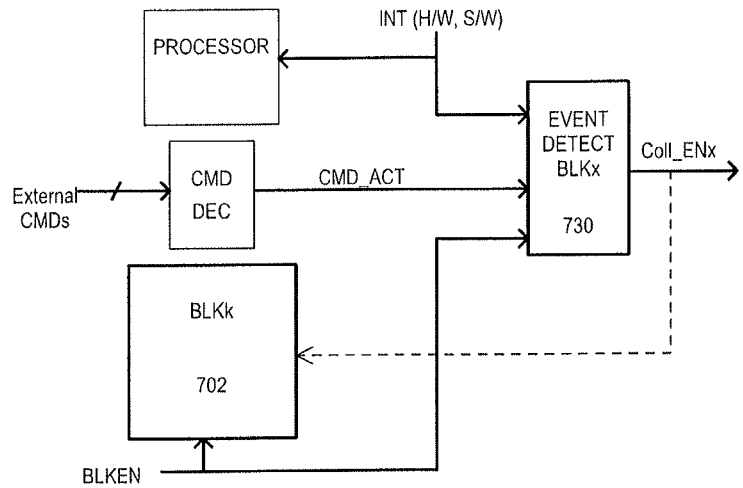
FIG. 7 is block schematic diagram of an event detect circuit that can be included in embodiments.

FIG. 7 is a block schematic diagram showing a collapse event detect arrangement of an IC device according to an embodiment. An event detect circuit 730 can activate its collapse enable signal Coll_ENx in response to a number of events (or combinations of such events). In the particular embodiment shown, an event detect circuit 730 can receive an interrupt signal (INT). An interrupt signal INT can be generated by hardware (e.g., in response to circuits operations) or in response to software (e.g., instructions executed by a processor). Event detect circuit 730 can also receive signals applied from a source external to the integrated circuit device. In the particular embodiment shown, one or more signals external to the IC device (External CMDs) can be received by an intermediate circuit (in this embodiment a command decoder), in response to such external signal(s), a signal CMD_ACT can be activated as an input to event detect circuit 730.

An event detect circuit 730 can also receive a block enable signal BLKEN as an input. A block enable signal BLKEN can enable a block 702 of the IC device. Enabling a block can include changing a state of the block, including from a "sleep" mode to an active mode. A block enable signal BLKEN can be for the block that includes the event detect circuit, or can be an entirely different block.

Figure 8:
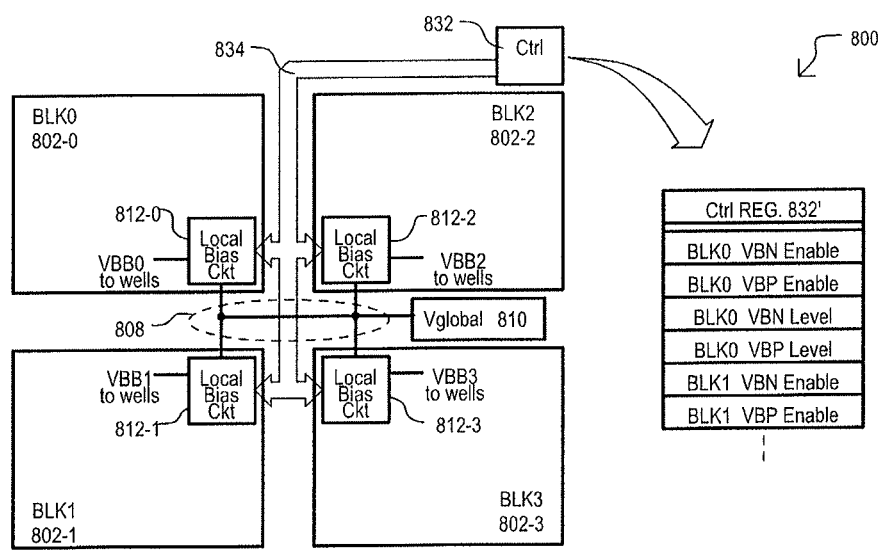
FIG. 8 is a block schematic diagram of an IC device according to another embodiment.

FIG. 8 is a top plan view of an IC device 800 according to another embodiment. An IC device 800 can include a number of blocks (802-0 to -3), global body bias supply 810, global body bias network 808, and local body bias circuits 812-0 to -3. Such sections can be the same as, and subject to the same variations as those of FIG. 1.

The embodiment of FIG. 8 also includes a digital bus 834 and control store 832. Local body bias circuits (812-0 to -3) can be controlled in response to multi-bit control values transmitted over digital bus 834, including values stored in control store 832. Note, that in embodiments that provide body biases for both NMOS and PMOS transistors, such blocks will have at least two local bias circuits, one for PMOS device and one for NMOS devices. A control store 832 can include any circuit structure suitable to provide digital values to digital bus 834. All or a portion of values within control store 832 can be writable from locations external to an IC device 800. In addition or alternatively, all or a portion of the values of control store 832 can be established by a manufacturing step of the IC device (i.e., mask option, assembly option etc.). It is noted that in some embodiments, an IC device 800 may be subdivided into components that are on die and are off die and feed in from a system in which IC device 800 is placed. For instance, control store 832 may be implemented on a system and coupled to IC device 800 via digital bus 834, without control store 832 being fabricated onto the a die together with other components shown in IC device 800.

FIG. 8 shows a control store 832' according to one very particular embodiment. A control store 832' can be a register set that can store local bias control values for each block. In the embodiment shown, control store 832' can include a body bias enable value for different conductivity type transistors (BLKx VBN Enable, BLKx VBP Enable, where x is a block identifier). Such values can enable or disable reverse body bias for transistors of the block. Control store reg. 832' can also include a body bias level value for different conductivity type transistors (BLKx VBN Level, BLKx VBP Level, where x is a block identifier). Such values can establish the level of the reverse body bias for transistors of the block.

Figure 9:
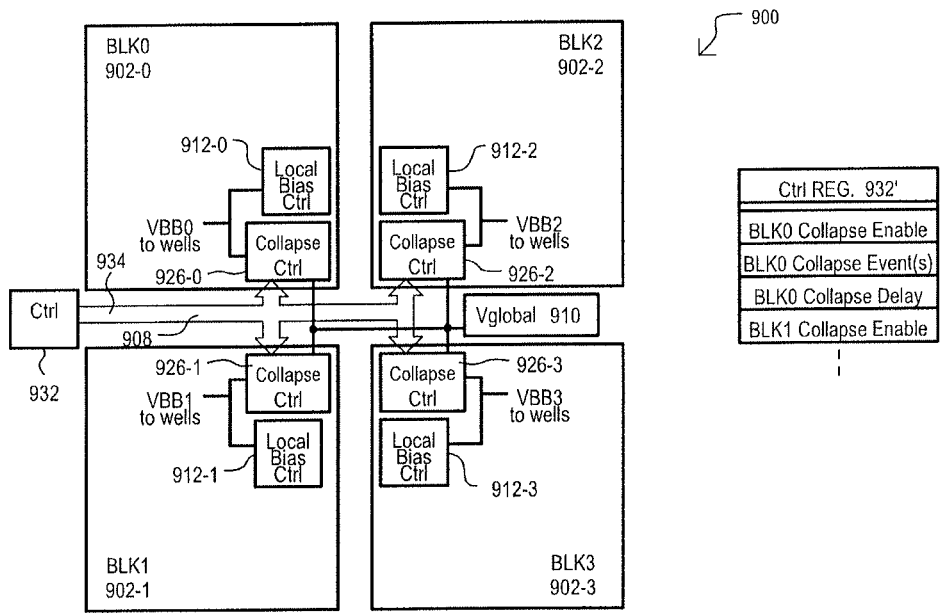
FIG. 9 is a block schematic diagram of an IC device according to a further embodiment.

FIG. 9 is a top plan view of an IC device 900 according to another embodiment. An IC device 900 can include a number of blocks (902-0 to -3), global body bias supply 910, global body bias network 908, and local body bias circuit 912-0 to -3. IC device 900 can be on the same die or may be subdivided so that some components are on a die and other components are off die and located on a system on which the die is assembled. Such sections can be the same as, and subject to the same variations as those of FIG. 1.

The embodiment of FIG. 9 also includes a digital bus 934 and control store 932. Collapse circuits (926-0 to -3) for each block can be controlled in response to multi-bit control values transmitted over digital bus 934, including values stored in control store 932. A control store 932 can include circuit structures such as those noted for 832 in FIG. 8, or equivalents.

FIG. 9 shows a control store 932' according to one very particular embodiment. A control store 932' can be a register set that can store local collapse control values for each block. In the embodiment shown, control store 932' can include a collapse enable value for each block (BLKx Collapse Enable, where x is a block identifier). Such values can enable or disable the collapse circuit for block. Control store 932' can also include a collapse event value (BLKx Collapse Event(s)). Such a value can establish for which events/inputs a collapse operation can occur. Control store 932' can also include a collapse delay value (BLKx Collapse Delay). Such a value can establish a delay between an input to a collapse circuit, and the resulting collapse operation.

It is understood that embodiments can combine items of FIGS. 8 and 9, to provide an IC device with digital control of both reverse body bias levels, as well as collapse operations.

Figure 10A:
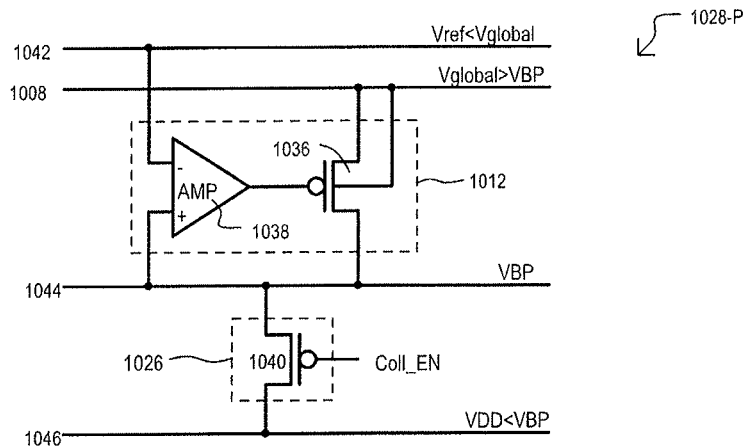
FIGS. 10A and 10B are schematic diagrams of body bias control circuits according to embodiments.

FIG. 10A is a block schematic diagram of a body bias control circuit 1028-P for p-channel transistors according to an embodiment. Body bias control circuit 1028-P can include local body bias circuits 1012 and a collapse circuit 1026. A local body bias circuit 1012 can be a low dropout regulator (LDO) type circuit, and can include an amplifier 1038 and a bias device 1036. Amplifier 1038 can have a (−) input connected to receive a reference voltage (Vref), a (+) input connected to receive the generated body bias voltage VBP (i.e., a feedback value), and an output that drives the bias device. Reference voltage (Vref) can be carried on a reference line 1042 that can be for transistors of one block, or multiple blocks. A reference voltage (Vref) can establish a reverse body bias voltage VBP. As shown, a reference voltage Vref can be less than a global body bias voltage Vglobal.

A bias device 1036 can be a p-channel transistor having source and body connected to receive a global body bias value (Vglobal), a gate coupled to the output of amplifier 1038, and a drain connected to provide the body bias voltage (VBP) on body bias line 1044 (i.e., the drain is connected to one or more wells or other active regions containing p-channel transistors). A global body bias voltage (Vglobal) can be provided on a global body bias network 1008, which can provide such a value to multiple different blocks. In particular embodiments, a bias device 1036 can be a high voltage transistor (i.e., a transistor designed to withstand higher voltage levels than other transistors of the IC device, such as a thicker gate insulator, for example).

According to a difference between Vref and VBP, amplifier 1038 can drive bias device to raise or lower VBP with respect to Vglobal. In particular, as VBP falls below Vref, amplifier 1038 will increase the conductivity of bias device 1036 until VBP reaches a desired level.

A collapse circuit 1026 can include a collapse device 1040. A collapse device 1040 can drive VBP to a lower power supply level VDD in response to signal Coll_EN. A lower power supply (VDD) level can be lower than VBP.

To avoid large current draw through device 1036 (a contention state) the body bias control circuit may have a disable (not shown, but discussed for another embodiment below) asserted when Coll_EN is asserted. Alternatively, Vref may be set to the local VDD value during collapse events, which will also essentially turn off bias device 1036.

Figure 10B:
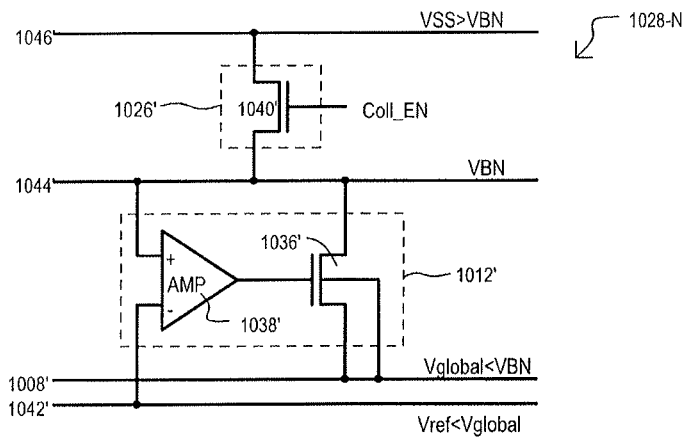

FIG. 10B is a block schematic diagram of a body bias control circuit 1028-N like that of FIG. 10A, but for n-channel transistors. The operation of body bias control circuit 1028-N is understood from the description of FIG. 10A.

Figure 11A:
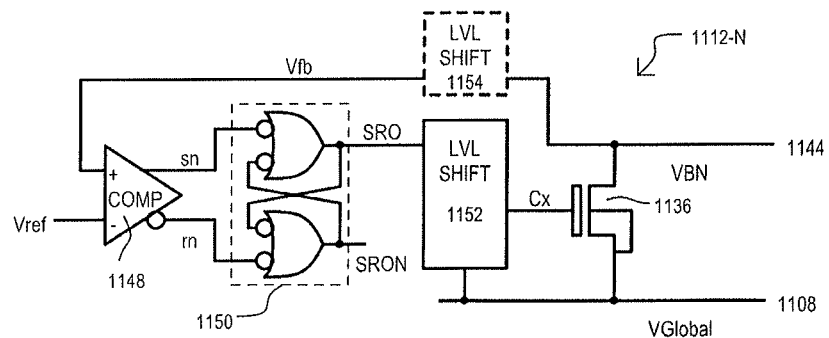
FIGS. 11A and 11B are schematic diagrams of local bias circuits according to embodiments.
Figure 11B:
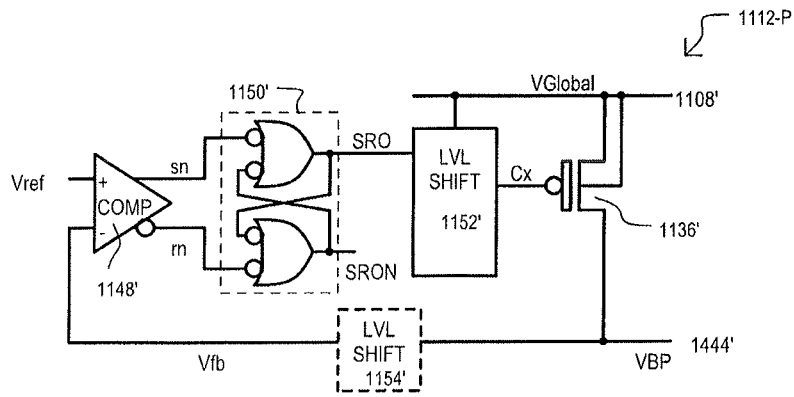

While embodiments can include continuous (e.g., analog) control of local reverse body bias voltages, alternate embodiments can include pulsed (e.g., digital) control of reverse body bias voltages. FIGS. 11A and 11B show particular examples of such embodiments.

FIG. 11A shows a local bias circuit 1112-N for n-channel transistors according to an embodiment. Local body bias circuit 1112-N can include a comparator 1148, toggle logic 1150, a level shifter 1152, a bias device 1136, and optionally, a second level shifter 1154. A comparator 1148 can have a (+) input connected to receive a feedback voltage (Vfb), that corresponds to the local body bias voltage VBN, a (−) input connected to receive a reference voltage (Vref), and an output connected to toggle logic 1150.

Toggle logic 1150 can toggle between high and low values based on an output of comparator 1148. In the particular embodiment shown, toggle logic 1150 can be an SR type flip-flop circuit, with an output to level shifter 1152. Level shifter 1152 can shift output values from a lower voltage domain to a higher voltage domain. In the embodiment shown, level shifter 1152 can ensure a low value from toggle logic 1150 is driven to VGlobal. An output of level shifter 1152 can turn bias device 1136 off and on.

Bias device 1136 can be an n-channel transistor having source and body connected to VGlobal, a gate connected to receive the output of level shifter 1152 (Cx), and a drain connected to provide the body bias voltage (VBN) on body bias line 1144 (i.e., the drain is connected to one or more wells or other active regions containing n-channel transistors). A global body bias voltage (Vglobal) can be provided on a global body bias network 1108, which can provide such a value to multiple different blocks. Optional level shifter 1154 can shift a body bias voltage VBN to ensure compatibility with the common mode input range of comparator 1148. A bias device 1136 can be a high voltage transistor. The comparator may be continuous-time as shown, or clocked (i.e., a dynamic comparator).

If VBN is above a predetermined level, Vfb will be greater than Vref, and the output of comparator 1148 will be driven high. Toggle logic 1150 will drive level shifter 1152 accordingly, which will drive signal Cx high. This turns on the bias device 1136, resulting in the local body bias VBN being driven lower. Once VBN is above a predetermined level, Vfb will be below Vref, and the output of comparator 1148 will be driven low. By operation of toggle logic 1150 and level shifter 1152, signal Cx will be driven low, turning off bias device 1136. Thus, bias device 1136 can be continually turning on and off to maintain VBN at a desired level.

FIG. 11B is a block schematic diagram of a local bias circuit 1112-P like that of FIG. 11A, but for p-channel transistors. The operation of local bias circuit 1112-P is understood from the description of FIG. 11A.

In some embodiments, the activation of a bias device (which establishes a body bias level from a global body bias) and the activation of a collapse device can be interlocked with one another. In particular, a bias device will be disabled when the corresponding collapse device is enabled. Particular examples of such embodiments will now be described.

Figure 12A:
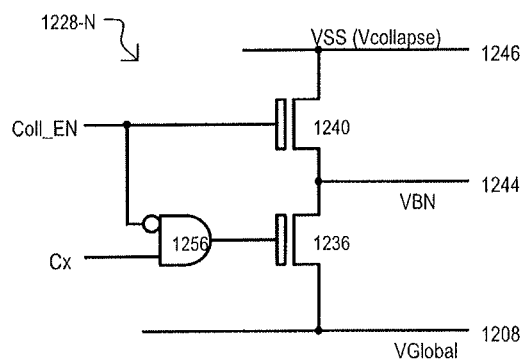
FIGS. 12A and 12B are schematic diagrams of body bias control circuits according to further embodiments.

FIG. 12A is a block schematic diagram of a body bias control circuit 1228-N for n-channel transistors according to an embodiment. Body bias control circuit 1228-N can include a bias device 1240, a collapse device 1236, and interlock logic 1256. Bias device 1240 can be an n-channel transistor having a source-drain path connected between a global body bias voltage (VGlobal) and a local body bias output 1244, and a gate connected to an output of interlock logic. Collapse device 1236 can have a source-drain path connected between a collapse voltage (which is a lower power supply voltage VSS in this particular embodiment) and the local body bias output 1244. In particular embodiments, either or both of bias and collapse devices (1240/1236) can be high voltage tolerant transistors.

Interlock logic 1256 can ensure that bias device 1240 is turned off whenever a collapse operation occurs (i.e., Coll_EN is high). Further, interlock logic 1256 can ensure that bias device 1240 is turned on only when there is no collapse operation (i.e., Coll_EN is low).

Figure 12B:
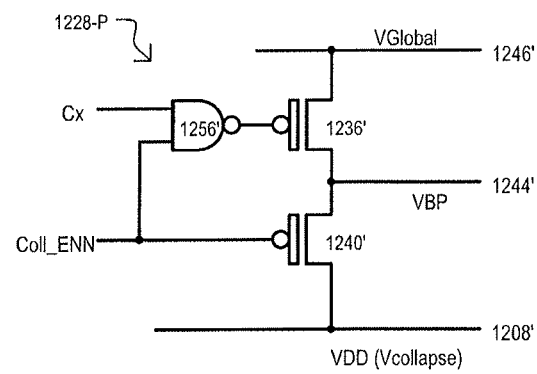

FIG. 12B is a block schematic diagram of a body bias control circuit 1228-P like that of FIG. 12A, but for p-channel transistors. The operation of body bias control circuit 1228-P is understood from the description of FIG. 12A, where control signal Coll_ENN is asserted active low rather than high.

Figure 13:
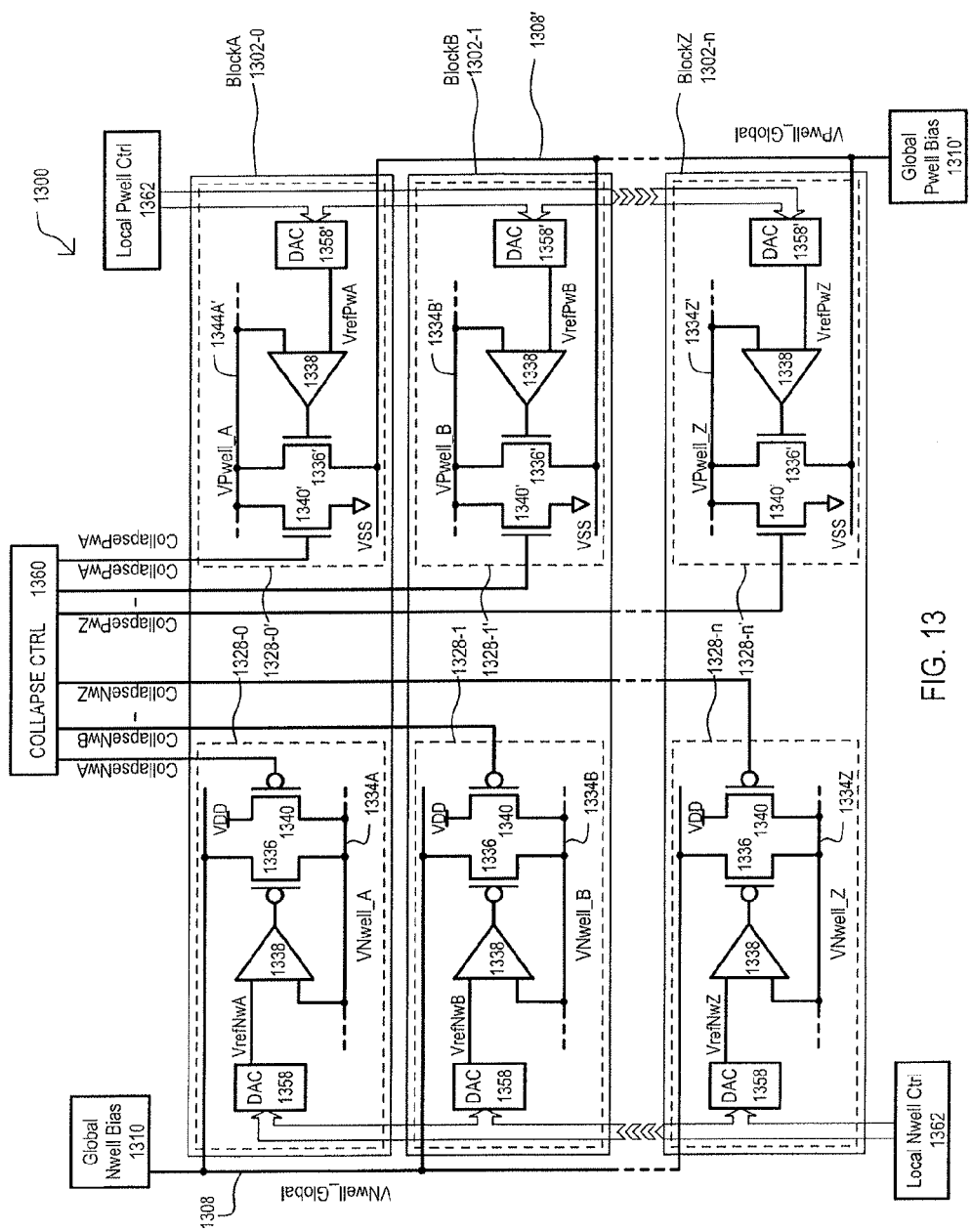
FIG. 13 is a block schematic diagram of an IC device according to another embodiment.

FIG. 13 is a block schematic diagram of an IC device 1300 according to another embodiment. In a very particular embodiment, IC device 1300 can be one implementation of a device like that shown in FIGS. 8 and/or 9. An IC device 1300 can include a number of blocks 1302-0 to -n, each of which can include p-wells which can contain n-channel transistors, as well as n-wells which can contain p-channel transistors. Transistors can take the form of any of those described herein, or equivalents. N-wells within each block (1302-0 to -n) can be driven to a bias voltage (VNwell_A, _B ... _Z) by a corresponding bias control circuit 1328-0 to -n. Such n-well bias voltages can be connected to their n-wells via local bias lines (1334A to 1334Z). In a like fashion, p-wells within each block (1302-0 to -n) can be driven to a bias voltage (VPwell_A, _B ... _Z) by a corresponding bias control circuit 1328-0' to -n'. Such p-well bias voltages can be connected to their p-wells via local bias lines (1334A' to 1334Z').

Bias control circuits for the p-wells (1328-0 to -n) can each include a digital-to-analog converter (DAC) 1358, amplifier 1338, bias device 1336, and collapse device 1340. DACs 1358 can receive input digital values from a local control circuit 1362, and from such values can generate reference voltages (VrefNwA to VrefNwZ). Amplifiers 1338 can have one input connected to receive the reference voltage (VrefNwA to VrefNwZ) and another input connected to the corresponding n-well (i.e., via 1334A to 1334Z). Output of amplifiers 1338 can control corresponding bias devices 1336. Bias devices 1336 can be p-channel transistors having source-drain paths connected between a global bias voltage VNwell_Global and their corresponding n-well. In such an arrangement, based on a difference between a reference voltage (VrefNwA to VrefNwZ) and a well voltage, the conductivity of the bias device 1336 can be varied to maintain the n-well at a desired bias voltage.

Collapse devices 1340 can be p-channel transistors having source-drain paths connected between the local power supply voltage (e.g., VDD) and their corresponding n-well. Activation of collapse devices 1340 can be controlled via signals from a collapse control circuit 1360.

Bias control circuits for the n-wells (1328-0' to -n') can have structures like those for the p-wells, but include n-channel bias devices 1336' and collapse devices 1340'. Bias control circuits (1328-0' to -n') can operate in a similar fashion, varying the conductivity of the bias devices 1336' according to a difference between a reference voltage (VrefPwA to VrefPwZ) and the voltage of their corresponding p-well. Reference voltages (VrefPwA to VrefPwZ) can be generated from digital values output from local control circuit 1362'. Collapse devices 1340', when activated by collapse control circuit 1360, can collapse their corresponding well to the local power supply voltage (e.g., VSS).

Figure 14:
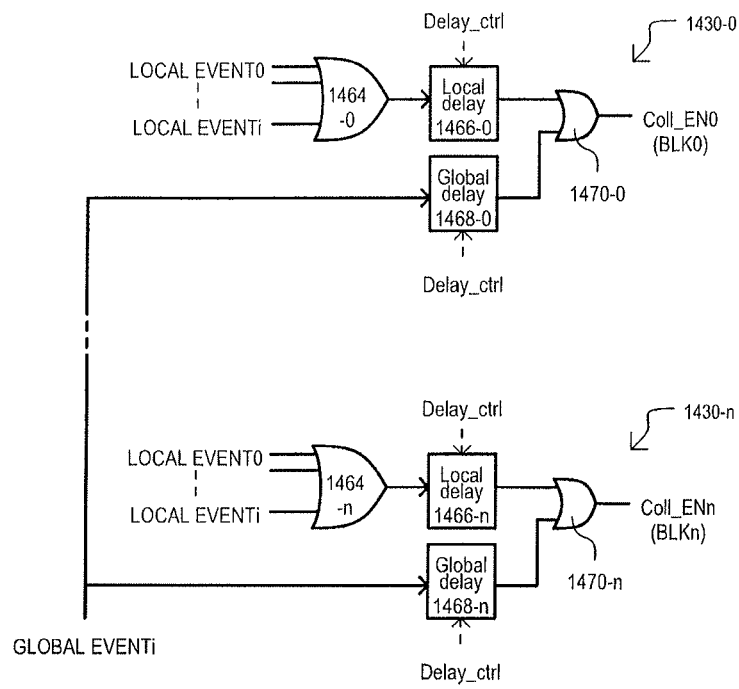
FIG. 14 is block schematic diagram of event detect circuits that can be included in embodiments.

FIG. 14 shows event detect circuits 1430-0 to -n according to embodiments. Each event detect circuit (1430-0 to -n) can activate a collapse enable signal (Coll_EN0 to Coll_ENn), which can collapse a body bias (e.g., well) voltage to a predetermined level in response to particular events.

Each event detect circuit can include local logic 1464-0 to -n, local delay 1466-0 to -n, global delay 1468-0 to -n, and output logic 1470-0 to -n. Local logic (1464-0 to -n) can combine signals corresponding to local events (i.e., events occurring on the block itself) (LOCAL EVENT0 to i). In the particular embodiment of FIG. 14, local logic can be an OR gate, but any suitable logic can be employed. Local delay (1466-0 to -n) can add delay to time the assertion or de-assertion of a signal. In some embodiments, such delay can be programmable. Global delay (global delay 1468-0 to -n) can delay a global event indication (i.e., an event outside of the block) (GLOBAL EVENTi). Output logic 1470-0 to -n can combine local and global event indications to generate the collapse enable signal (Coll_EN0 to Coll_ENn).

According to an embodiment, during the IC power up sequence, the charge pumps may not have time to drive the global bias values to their correct values. In this case, the core devices may be temporarily forward body biased, causing excessive power up currents. Consequently, one such GLOBAL EVENT may be the power up sequence, whereby the local body biases may be driven to the local supply voltages (applying zero body bias rather than forward body bias). When the supplies, including the global well biases, have been determined to be at their nominal voltages, the GLOBAL EVENT condition may be de-asserted to allow local well biases to be reverse biased, further reducing leakage currents.

While embodiments herein can include IC devices that generate local body bias voltages from global body bias voltages, embodiments can also include power-on sequences for such devices. A power-on sequence according to one particular embodiment is shown in FIG. 15.

Figure 15:
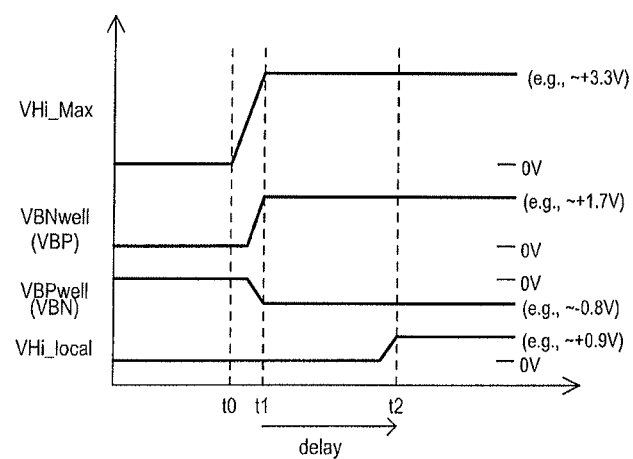
FIG. 15 is a timing diagram showing a power-up operation of an IC device according to an embodiment.

FIG. 15 is a timing diagram of a power on sequence for an IC device. FIG. 15 includes the following waveforms: VHi_Max shows a high power supply voltage that can be provided to particular circuits in the IC device; VBNWell can be a reverse body bias generated for p-channel devices (i.e., VBP); VBPWell can be a reverse body bias generated for n-channel devices (i.e., VBN); and VHi can be a power supply voltage less than VHi_Max, provided to circuits with transistors subject to one or both reverse body bias voltages.

In one very particular embodiment, VHi_Max can be a power supply for a charge pump circuit that generates a global negative body bias used to generate VBPwell, and can have a level of about +3.3V. A positive reverse body bias (VBNwell) can be about +1.7V (which is greater than Vhi). A reverse body bias (VBPwell) can be about −0.9V. Vhi can be about +0.9V, and can be a supply voltage to p-channel transistors having the reverse body bias voltage VBNwell (of about +1.7V).

Referring still to FIG. 15, as shown, the power voltage Vhi can be enabled only after the VHi_Max and VBNwell/VBPwell have been settled. In one particular embodiment, Vhi_Max can rise first, enabling the local body bias voltages (VBNwell/VBPwell) to be generated. Only after such actions is power supply Vhi allowed to rise (shown by "delay").

Figure 16:
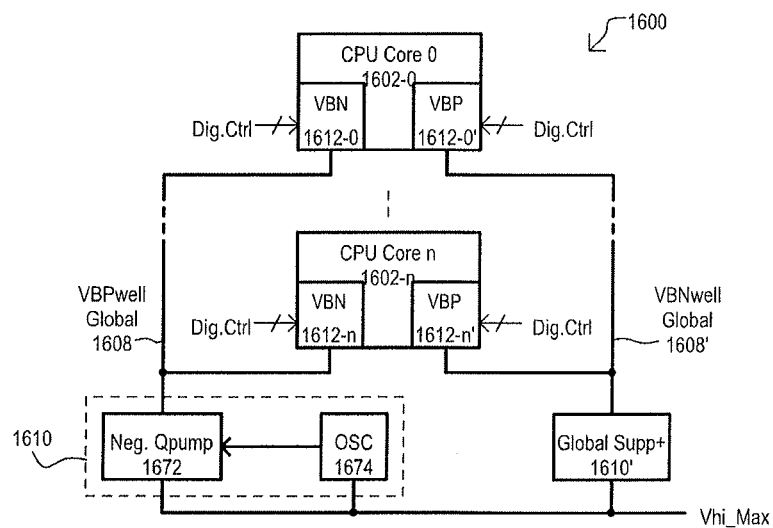
FIG. 16 is a block schematic diagram of an IC device according to another embodiment.

FIG. 16 is a block schematic diagram of an IC device 1600 according to another embodiment. An IC device 1600 can incorporate a power-up sequence like that shown in FIG. 15. An IC device 1600 can include a number of blocks 1602-0 to 1602-n, which in the particular embodiment shown, can be CPU cores. Each block (1602-0 to -n) can include local bias circuits 1612-0 to -n that can generate a local n-channel body bias (i.e., a p-well bias) for its block, and local bias circuits 1612-0' to -n' that can generate a local p-channel body bias (i.e., an n-well bias) for its block.

Local bias circuits (1612-0 to -n) can generate their local body bias voltages (VBN) from a negative global body bias voltage (VBPwell Global) provided to each block (1602-0 to -n) via a global network 1608. Local body bias voltages (VBN) can set with corresponding digital values (Dig. Ctrl). In a similar fashion, local bias circuits (1612-0' to -n') can generate their local body bias voltages (VBP) from a positive global body bias (VBNwell Global) provided to each block (1602-0 to -n) via a global network 1608'.

In the embodiment shown, a negative global body bias voltage (VBPwell Global) can be provided from a global source 1610, which can include a charge pump circuit 1672 controlled by an oscillator circuit 1674. Charge pump circuit 1672 and oscillator circuit 1674 can operate at a voltage Vhi_Max, which can be an externally provided high supply voltage, such as the high voltage input-output (VDDIO) power supply.

A positive global body bias voltage (VBNwell Global) can be provided from global bias circuit 1610', which in a particular embodiment can be DC-DC converter circuit, which can convert the voltage Vhi_Max, to a lower voltage level with high efficiency.

In a power up operation, Vhi_Max (e.g., ~+3.3V) can be applied. A lower power supply voltage (e.g., ~+0.9V) is not immediately enabled. In response to Vhi_Max, oscillator circuit 1674 can generate an oscillating signal as an input to charge pump circuit 1672. In response, the charge pump circuit 1672 can start to generate a negative global bias voltage (VBPwell Global). In response to negative global bias voltage (VBPwell Global), local bias circuits (1612-0 to -n) can generate their local body bias voltages (VBN).

At the same time, global source 1610' can generate a positive global supply voltage (VBNwell Global) (e.g., ~+2.2V) from the Vhi_Max voltage (e.g., ~+3.3V). Once the high power supply voltage (VBNwell Global) is established, local bias circuits (1612-0' to -n') can generate their local body bias voltages (VBP).

After the local body bias voltages (VBN/VBP) are stable, a lower power supply voltage (e.g., ~+0.9V) can then be enabled. Alternatively, the body biases may be pinned to the supply voltage so as not to apply forward body biases, until such time as the global body biases are stable.

Figure 17:
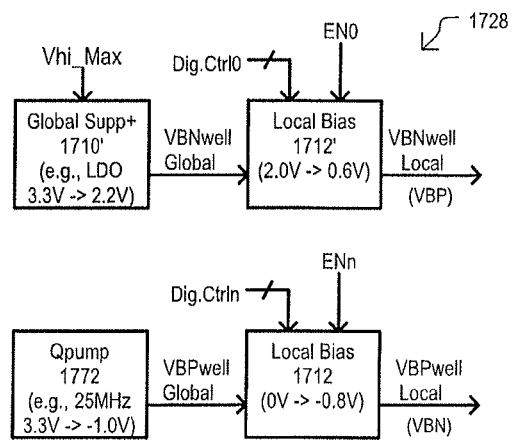
FIG. 17 is a block schematic diagram of a body bias control circuit that can be included in an IC device like that of FIG. 16, according to an embodiment.

FIG. 17 is a block schematic diagram of a bias control circuit 1728 according to an embodiment. In one particular embodiment, a bias control circuit 1728 can be one implementation of that for IC device of FIG. 16. Bias control circuit 1728 can include a positive global supply 1710', local bias circuits 1712' (only one shown), a charge pump circuit 1772, and local bias circuits 1712 (only one shown).

Positive global supply 1710' can be a DC-DC converter circuit that converts a high, positive power supply voltage (Vhi_Max) to a lower positive global bias voltage (VBNwell Global). In one particular embodiment, positive global supply 1710' can be an LDO circuit that converts a voltage (Vhi_Max) of about +3.3V to a voltage (VBNwell Global) of about +2.2V.

The lower positive global bias voltage (VBNwell Global) can be provided by local bias circuits 1712'. In the particular embodiment shown, a local bias circuit 1712' can generate a local body bias voltage (VBP/VBNwell Local) that varies according to a digital control value Dig. Ctrl0. Further, local bias control circuits 1712' can be individually enabled or disabled according to an enable signal EN0. In one very particular embodiment, local bias circuits 1712' can provide a local body bias voltage (VBP/VBNwell Local) that ranges from +2.0V to +0.6V.

Charge pump circuit 1772 can generate a negative global bias voltage (VBPwell Global). In one particular embodiment, charge pump 1772 can generate a negative global bias voltage (VBPwell Global) of about −1.0V, utilizing an oscillating signal of about 25 MHz and a power supply voltage of +3.3V.

The negative global bias voltage (VBPwell Global) can be provided local bias circuits 1712. In the particular embodiment shown, a local bias circuit 1712 can generate a local negative body bias voltage (VBN/VBPwell Local) that varies according to a digital control value Dig. Ctrln. Further, local bias control circuits 1712 can be individually enabled or disabled according to an enable signal ENn. In one very particular embodiment, local bias circuits 1712 can provide a local body bias voltage (VBN/VBPwell Local) that ranges from 0V to −0.8V.

Figure 18:
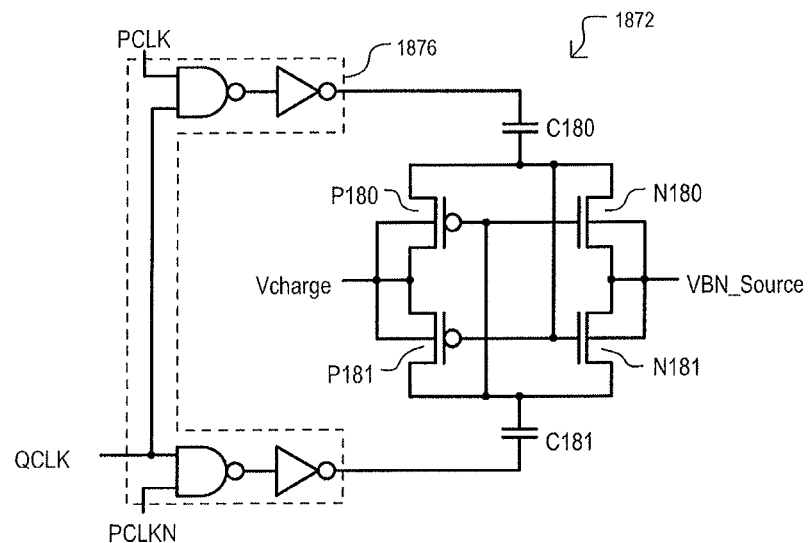
FIG. 18 is a schematic diagram of a charge pump circuit that can be included in embodiments.

FIG. 18 is a schematic diagram of a charge pump circuit 1872 that can be included in embodiments. Charge pump circuit 1872 can be one very particular implementation of that shown as 1672 in FIG. 16 or 1772 in FIG. 17. A charge pump circuit 1872 can include pump control logic 1876, a pump circuit formed by p-channel transistors P180/P181, n-channel transistors N180/N181, and pump capacitors C180/C181. Pump control logic 1876 can generate non-overlapping pulses to drive capacitors C180/C181.

Within the pump circuit, transistors P180/P181 can have sources and bodies commonly connected to a charge voltage Vcharge. Drains of transistors P180/181 can be cross coupled to their gates. Transistors N180/N181 can have sources and bodies commonly connected to an output node VBN_Source, which can provide the negative global supply voltage. Drains of transistors N180/181 can be cross coupled to their gates.

On one pump cycle, a polarity of signal applied to C181 from pump control logic 1876 can switch from high to low, and negative charge can be transferred to VBN_Source via transistor N181. In addition, a polarity of signal applied to C180 from pump control logic 1876 can switch from low to high, and transistor C180 can charge via transistor P180. On the next pump cycle, a polarity of signal applied to C180 can switch from high to low, and negative charge can be transferred to VBN_Source via transistor N180. The polarity of the signal applied to C180 can switch from low to high, and transistor C181 can charge via transistor P181.

Figure 19:
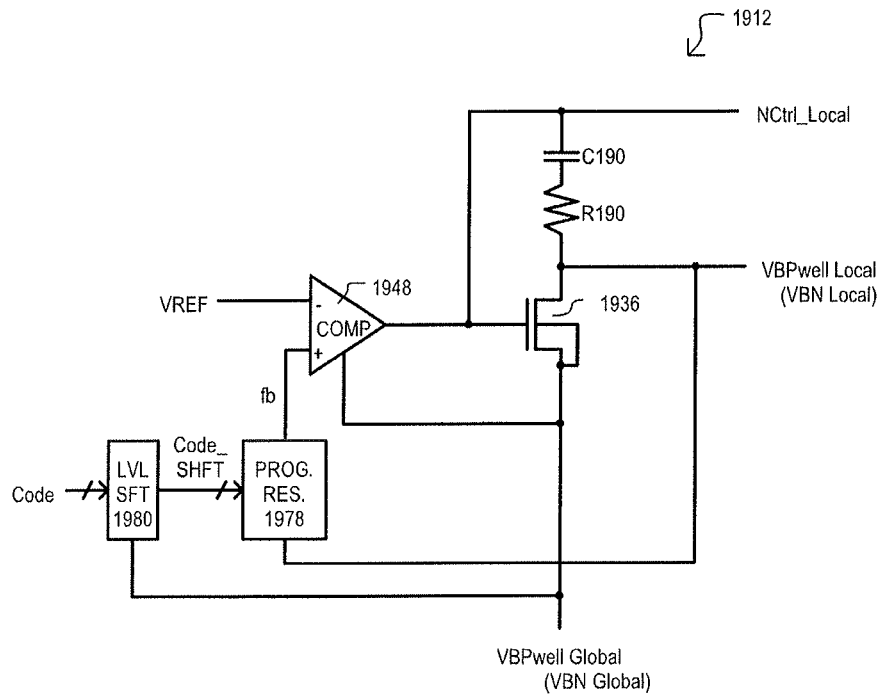
FIG. 19 is a block schematic diagram of a local bias circuit that can be included in an IC device like that of FIG. 16, according to an embodiment.

FIG. 19 is a schematic diagram of a local bias circuit 1912 according to an embodiment. Local bias circuit 1912 can be one very particular implementation of that shown as 1612 in FIG. 16 or 1712 in FIG. 17. A local bias circuit 1912 can include a comparator 1948, a bias device 1936, a programmable resistance circuit 1978, and a level shifter 1980. A comparator 1948 can have a (−) input connected to receive a reference voltage VREF, a (+) input connected to an output (VBPwell Local) via a feedback path that includes programmable resistance circuit 1978, and output that drives bias device 1936.

Bias device 1936 can be an n-channel transistor having a source and body connected to receive a negative global bias voltage (VBPwell Global), a gate connected to the output of the comparator 1948, and a drain that provides the local body bias voltage (VBPwell Local).

As noted above, a programmable resistance circuit 1978 can be included in a feedback path between the local body bias voltage (VBPwell Local) and (+) input to the comparator 1948. A resistance presented by programmable resistance circuit 1978 can be established via a digital code (Code) applied via level shifter 1980. The level of the local body bias voltage (VBPwell Local) can be established with the digital code (Code).

If the local body bias voltage (VBPwell Local) is above a predetermined level which is set by the digital (Code), the (+) input to the comparator 1948 will be greater than Vref, and the output of comparator 1948 will be driven high, turning on bias device 1936, to pull the local body bias voltage (VBPwell Local) lower (i.e., toward VBPwell Global). Once the local body bias voltage (VBPwell Local) is below the predetermined level (again, set by the digital (Code)), the (+) input to the comparator 1948 will be greater than Vref, and the output of comparator 1948 will be driven low, turning off bias device 1936. Once the local body bias voltage (VBPwell Local) drifts high again, the bias device will be turned on. This repeats to maintain the local body bias voltage (VBPwell Local) within a desired range.

The output of the comparator 1948 can provide a control value NCtrl_Local, which can be used to control other bias devices. In the embodiment shown, the output of the comparator 1948 can be connected to the local body bias voltage (VBPwell Local) by a capacitor C190 and resistor R190.

Figure 20:
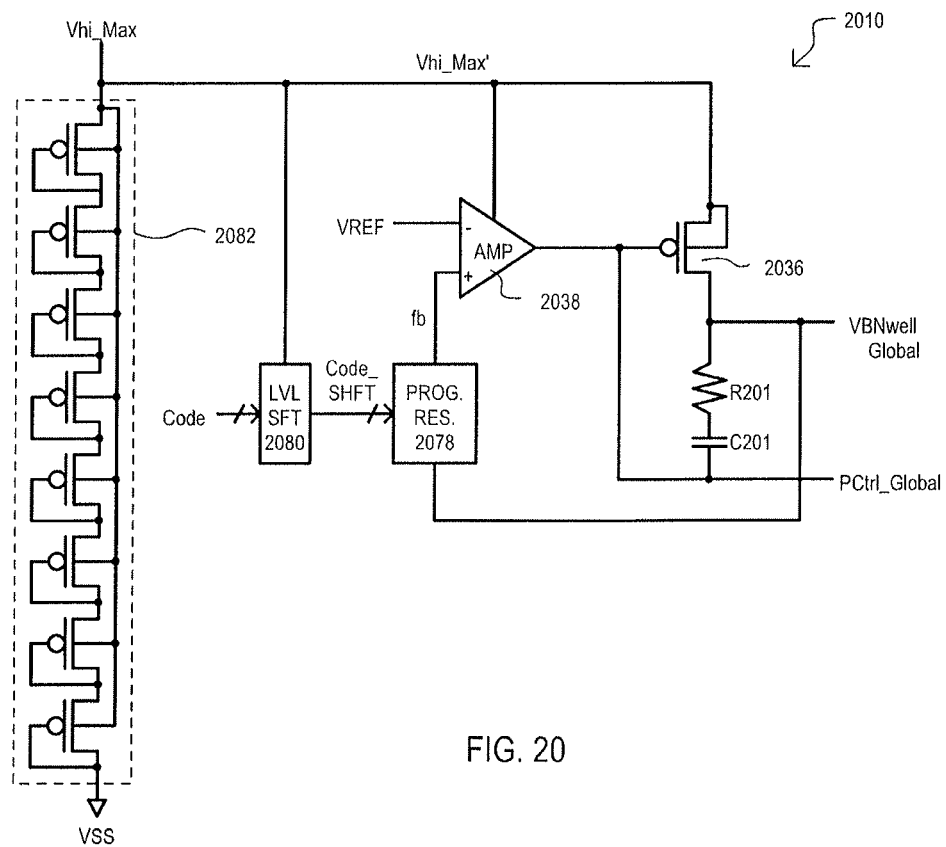
FIG. 20 is a block schematic diagram of a global bias supply circuit that can be included in an IC device like that of FIG. 16, according to an embodiment.

FIG. 20 is a schematic diagram of a global bias circuit 2010' according to an embodiment. Global bias circuit 1912 can be one very particular implementation of that shown as 1610' in FIG. 16 or 1710' in FIG. 17. Global bias circuit 2010' can be an LDO that includes an amplifier 2038, a bias device 2036, a programmable resistance circuit 2078, a level shifter 2080, and a diode ladder 2082.

Diode ladder 2082 can include a number of p-channel transistors connected in a "diode" fashion (gates connected to drains) in series with one another between a low power supply voltage (VSS) and high power supply voltage (Vhi_Max). Diode ladder 2082 provides a bias voltage for amplifier 2038.

Amplifier 2038 can have a (−) input connected to receive a reference voltage VREF, a (+) input connected to an output (VBNwell Global) via a feedback path that includes programmable resistance circuit 2078, and output that drives bias device 2036.

Bias device 2036 can be a p-channel transistor having a source and body connected to receive the power-up controlled high supply voltage Vhi_Max', a gate connected to the output of amplifier 2038, and a drain that provides the positive global body bias voltage (VBNwell Global). Bias device and other constituent devices may be high voltage tolerant (e.g., thick-gate oxide).

In a manner like that of FIG. 19, programmable resistance circuit 2078 can be included in a feedback path between the global body bias voltage (VBNwell Global) and (+) input to the amplifier 2038. A resistance presented by programmable resistance circuit 2078 can be established via a digital code (Code). Thus, as the global body bias voltage (VBNwell Global) starts to move below a predetermined level (set by the digital (Code)), the (+) input to the amplifier 2038 will be less than Vref, and the output of amplifier 2038 will drive bias device 2036 to a more conductive state, to raise the global body bias voltage (VBNwell Global) higher (i.e., toward Vhi_Max'). Conversely, once the global bias voltage (VBNwell Global) returns to the predetermined level or above the level, the bias device 1936 will be driven to a less conductive state.

The output of the amplifier 2038 can provide a global value PCtrl_Global, which can be used to control other bias devices. In the embodiment shown, the output of the amplifier 2038 can be connected to the global body bias voltage (VBNwell Global) by a capacitor C201 and resistor R201.

Figure 21:
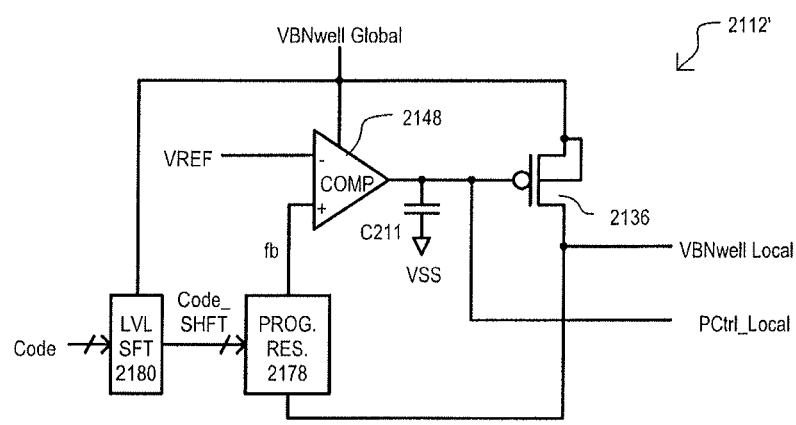
FIG. 21 is a block schematic diagram of another local bias circuit that can be included in an IC device like that of FIG. 16, according to an embodiment.

FIG. 21 is a schematic diagram of a local bias circuit 2112' according to an embodiment. Local bias circuit 2112' can be one very particular implementation of that shown as 1612' in FIG. 16 or 1712' in FIG. 17. A local bias circuit 2112' can include a comparator 2148, a bias device 2136, a programmable resistance circuit 2178, and a level shifter 2180. A comparator 2148 can have a (−) input connected to receive a reference voltage VREF, a (+) input connected to an output (VBNwell Local) via a feedback path that includes programmable resistance circuit 2178, and output that drives bias device 2136.

Bias device 2136 can be a p-channel transistor having a source and body connected to receive a positive global bias voltage (VBNwell Global), a gate connected to the output of the comparator 2148, and a drain that provides the local body bias voltage (VBPwell Local).

Local bias circuit 2112' can operate in a manner similar to that of FIG. 19. If the local body bias voltage (VBNwell Local) is below a predetermined level (set by the digital (Code)), the (+) input to the comparator 2148 will be lower than VREF, and the output of comparator 2148 will be driven low, turning on bias device 2136, to pull the local body bias voltage (VBNwell Local) higher (i.e., toward VBNwell Global). Once the local body bias voltage (VBNwell Local) is above the predetermined level, the (+) input to the comparator 2148 will be greater than VREF, and the output of comparator 2148 will be driven high, turning off bias device 2136. This repeats to maintain the local body bias voltage (VBNwell Local) within a desired range.

The output of the comparator 2148 can provide a control value PCtrl_Local, which can be used to control other bias devices. In the embodiment shown, a capacitor C211 can be connected between the output of the comparator 2148 and a low power supply voltage (VSS).

Figure 22:
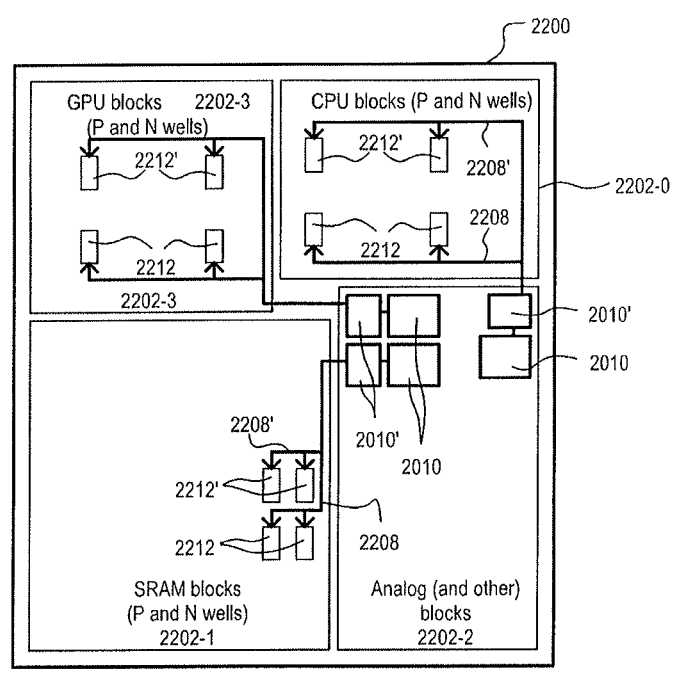
FIG. 22 is a top plan view of an IC device like that of FIG. 16, according to one particular embodiment.

FIG. 22 is a top plan view of a system configured as an IC device according to another embodiment. An IC device 2200 can be an SoC type device, including a CPU block 2202-0, an SRAM block 2202-1, an analog block 2202-2, and a GPU block 2202-3. Analog block 2202-2 can include negative global body bias sources 2010 and positive body bias sources 2010'. IC device 2200 can be fabricated on a single die, or can be implemented across multiple die with one or more blocks fabricated on their own die. Negative global body bias sources 2010 can take the form of any of those shown as 1610/1672 in FIG. 16 or 1772 of FIG. 17, or equivalents. Positive global body bias sources 2010' can take the form of any of those shown as 1610' in FIG. 16, 1710' in FIG. 17, or 2010 in FIG. 20.

Within blocks 2202-0/1/3 a negative global body bias voltage can be provided via a network 2208, while a positive global body bias voltage can be provided via a network 2208'. Blocks 2202-0/1 can also include local body bias circuits 2212, which can generate local negative body bias voltages for n-channel transistors from a global bias voltage on network 2208, as described in embodiments herein, or equivalents. Further, local body bias circuits 2212' can generate local positive body bias voltages for p-channel transistors from a global body bias voltage on a network 2208', as described in embodiments herein, or equivalents.

Figure 23A:
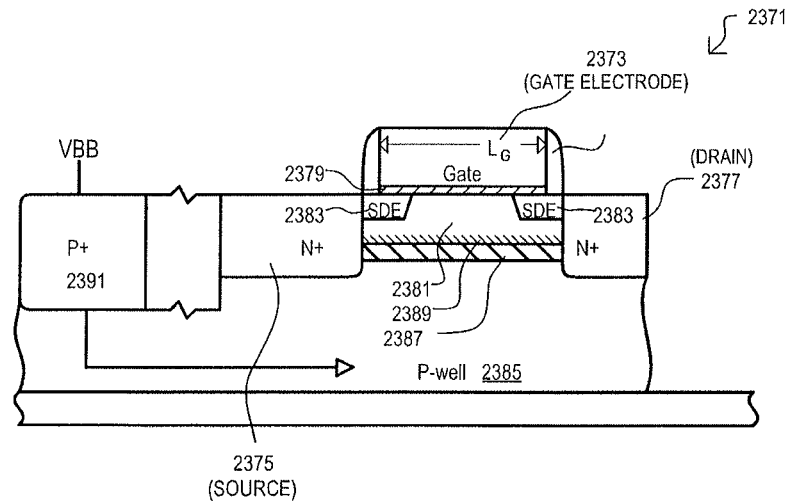
FIGS. 23A to 23C are side cross sectional views of transistors that can receive a body bias according to embodiments.

FIG. 23A shows a DDC type transistor 2371 that can receive a body bias voltage as described herein. A DDC transistor 2371 can be configured to have an enhanced body coefficient, along with the ability to set a threshold voltage (Vt) with enhanced precision. A DDC transistor 2371 can include a gate electrode 2373, source 2375, drain 2377, and a gate dielectric 2379 positioned over a substantially undoped channel 2381. Optional lightly doped source and drain extensions (SDE) 2383 can be positioned respectively adjacent to source 2375 and drain 2377. Such extensions 2383 can extend toward each other, reducing effective length of the substantially undoped channel 2381.

In FIG. 23A, DDC transistor 2371 is shown as an n-channel transistor having a source 2375 and drain 2377 made of n-type dopant material, formed upon a substrate such as a p-type doped silicon substrate providing a p-well 2385. In addition, the n-channel DDC transistor 2371 in FIG. 23A can include a highly doped screening region 2387 made of p-type dopant material, and an optional threshold voltage set region 2389 made of p-type dopant material.

A body bias voltage VBB can be applied via a tap 2391 to the p-well 2385. P-channel DDC transistors are understood to have reverse doping types as compared to an n-channel DDC.

Further descriptions of a DDC transistor as well as an exemplary fabrication process and other aspects of a DDC transistor can be found in U.S. Pat. No. 8,273,617, titled "Electronic Devices and Systems, and Methods for Making and Using the Same." A DDC transistor provides advantages for circuit design in that, among other reasons, a DDC transistor enables designs having pulled-in corners. The reason is the tighter distribution of the threshold voltage from device-to-device. Additionally, a DDC transistor includes a strong body coefficient by which body biasing can be used to further pull in design corners. A result of using a DDC transistor is the ability to implement improved integrated circuit designs according to desired targets for power and performance whereas when using conventional transistors circuit designers resort to designing conservatively for wider design corners thereby sacrificing the potential power and performance that could be otherwise achieved for a design. An advantage of using a DDC transistor as part of implementing on the embodiments described herein is in the ability to reliably design integrated circuits using a statistically-based, process variation-comprehending simulation model by which design corners could be shrunk.

Figure 23B:
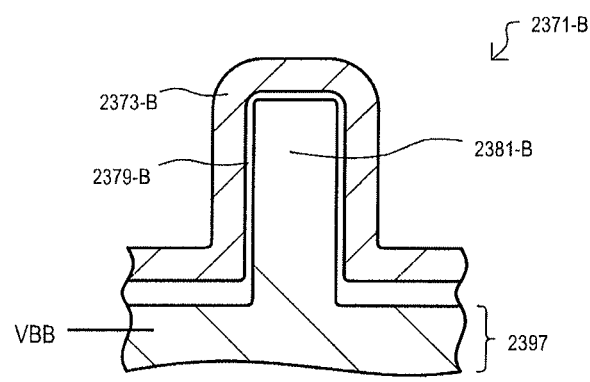

FIG. 23B shows a FinFET type transistor 2371-B that can receive a body bias voltage according to embodiments. FinFET transistor 2371-B can include a gate electrode 2373-B and gate dielectric 2379-B that surround a substantially undoped channel 2381-B on opposing sides. The view of FIG. 23B is taken along a channel length. Thus, it is understood that source and drain regions can extend into and out of the view shown. A body bias VBB can be applied via a connection to a substrate 2397.

Figure 23C:
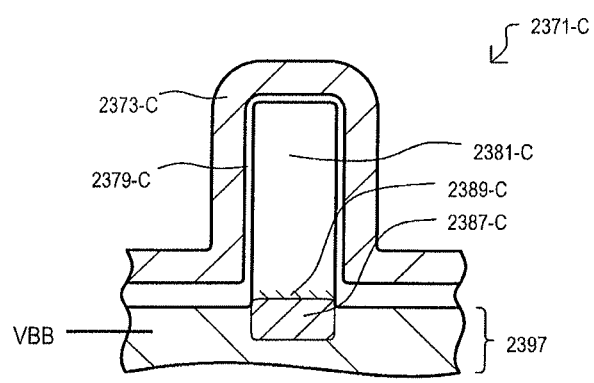

FIG. 23C shows a FinFET type transistor 2371-C having a screening region 2387-C, that can receive a body bias voltage according to embodiments. As in the case of FIG. 23A, the FinFET transistor 2371-C has a highly doped region that can be configured to have an enhanced body coefficient, along with the ability to set a Vt with enhanced precision. The transistor 2371-C includes a gate electrode 2373-C and gate dielectric 2379-C formed over a substantially undoped channel 2381-C on opposing sides. However, unlike FIG. 23B, a highly doped region 2387-C can be formed in a substrate 2397 below substantially undoped channel 2381-C rising upward three-dimensionally. Optionally, a Vt set region 2389-C can be formed between the screening region 2387-C and substantially undoped channel 2381-C.

As in the case of FIG. 23B, the view of FIG. 23C is taken along a channel length, and source and drain regions can extend into and out of the view, separated from screening region 2387-C by portions of undoped channel region 2381-C. A body bias VBB can be applied via a connection to a substrate 2397. Further descriptions of a finFET transistor having a highly doped region can be found in patent application International Application No. PCT/US12/49531 titled "Semiconductor Devices Having Fin Structures and Fabrication Methods Thereof".

It should be appreciated that in the foregoing descriptions of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of the invention.

It is also understood that the embodiments may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A method, comprising:
supplying a first power supply voltage for a charge pump circuit that generates a global body bias voltage;

generating a local body bias voltage from the global body bias voltage;

waiting for a predetermined delay after the local body bias voltage reaching and being stable at a predetermined value, and then supplying a second power supply voltage applied for transistors having the local body bias voltage while the local body bias voltage is stable at the predetermined value, the second power supply voltage being lower than the first power supply voltage.

2. The method of claim 1, further including:

in response to at least one local event and in response to a global event, coupling bodies of the transistors to a collapse voltage that tracks the first power supply voltage.

3. The method of claim 1, wherein:

the transistors including deeply depleted channel (DDC) transistors, each DDC transistor comprises a body with a screening region of a dopant concentration of no less than $1\times10^{18}$ dopant atoms/cm$^3$ formed below a transistor channel.

* * * * *